(12) United States Patent
Sugiyama

(10) Patent No.: US 6,577,731 B1
(45) Date of Patent: Jun. 10, 2003

(54) METHOD AND APPARATUS OF CANCELLING MULTI-CHANNEL ECHOES

(75) Inventor: Akihiko Sugiyama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/388,398

(22) Filed: Sep. 1, 1999

(30) Foreign Application Priority Data

Sep. 2, 1998 (JP) .......................................... 10-248025

(51) Int. Cl.[7] .............................................. H04M 9/08
(52) U.S. Cl. ............................ 379/406.01; 379/406.02; 379/406.03; 379/406.05; 379/406.06; 379/406.08; 379/406.09; 379/406.12; 379/406.13
(58) Field of Search ................................ 379/400–412, 379/406.01, 406.16

(56) References Cited

U.S. PATENT DOCUMENTS

| | | | |
|---|---|---|---|
| 4,268,727 A | * | 5/1981 | Agrawal et al. |
| 5,323,459 A | * | 6/1994 | Hirano ........................ 379/391 |
| 5,371,789 A | * | 12/1994 | Hirano |
| 5,396,554 A | * | 3/1995 | Hirano et al. ............... 379/410 |
| 5,568,411 A | * | 10/1996 | Batruni |
| 5,761,318 A | * | 6/1998 | Shimauchi et al. ........... 381/66 |
| 5,790,658 A | * | 8/1998 | Yip et al. |
| 5,828,756 A | * | 10/1998 | Benesty et al. ............... 381/66 |
| 5,841,856 A | * | 11/1998 | Ide .............................. 379/406 |
| 5,856,970 A | * | 1/1999 | Gee et al. ..................... 370/286 |
| 5,896,452 A | * | 4/1999 | Yip et al. ..................... 379/410 |
| 5,960,077 A | * | 9/1999 | Ishii et al. ................... 379/410 |

OTHER PUBLICATIONS

Yann Joncour, et al.—"A Stereo Echo Canceler With Correct Echo–Path Identification and Good Sound Localization," 4 pages.

Yann Joncour, et al.—"A New Stereo Echo Canceler with Pre–Processing Combined with Nonlinear Transformations," pp. 183–188.

Yann Joncour, et al.—"A Stereo Echo Canceler With Pre–Processing For Correct Echo–Path Identification," IEEE, Jun. 1998, pp. 3677–3680.

* cited by examiner

Primary Examiner—Forester W. Isen
Assistant Examiner—Ramnandan Singh
(74) Attorney, Agent, or Firm—Dickstein Shapiro Morin & Oshinsky LLP

(57) ABSTRACT

The magnitude processing circuit 607 non-linearly processes the received signal 2 and then outputs a non-linear processed signal. The delay processing circuit 300 further delays the non-linear processed signal and then outputs a delayed processed signal. The delayed processed signal is time-multiplexed with the non-linear processed signal. The multiplexed signal is used instead of the received signal 2. The adaptive filters 122 and 124 operate alternately with the non-linear processed signal or with the delayed processed signal obtained by non-linearly processing and then delaying the received signal 2 as the input signal. Adaptive filter coefficients can be obtained by using twice the number of conditions compared with the number is twice that for the case where only the received signal 2 is used as the input signal.

66 Claims, 24 Drawing Sheets

EXAMPLE OF FILTER CONFIGURATION

SPECIAL EXAMPLE OF FILTER CONFIGURATION

METHOD AND APPARATUS OF CANCELLING MULTI-CHANNEL ECHOES

BACKGROUND OF THE INVENTION

The present invention relates to a method or apparatus for canceling echoes in the system using plural received signals and a single or plural transmission signals.

There are multi-channel echo canceling methods or apparatuses that remove echoes caused by received signals propagating through spatial acoustic paths in the system of transmitting plural received signals or a single or plural transmission signals. Two types of multi-channel echo canceling apparatuses including a cascade connection type and a linear coupled type have been proposed in the Technical Report of the Institute of Electronics, Information and Communication Engineers (IEICE) of Japan, Vol. 84, No. 330, pp. 7–14, CS-84-178 (hereinafter referred to as reference 1). According to the reference (1), the cascade connection type is inferior to the linear coupled type in echo suppression capability caused by the constitutional constraint. Here, the case where a linear coupled multi-channel echo canceling apparatus (echo canceller) is applied to a two-channel system, together with received signals and transmission signals, will be described below as a prior art.

FIG. 24 shows a linear coupled multi-channel echo canceller. The first loudspeaker 3 reproduces the first received signal 1. The second loudspeaker 4 reproduces the second received signal 2. The first echo 5 which is generated as the signal propagating via spatial acoustic paths from the first loudspeaker 3 to the first microphone 9 and the second echo 6 which is produced as the signal propagating through spatial acoustic paths from the second loudspeaker 4 to the first microphone 9 are added to the first transmission signal 12 or the voice of the talker 11 received with the first microphone 9, so that a first mixed signal 14 is created. Similarly, the third echo 7 which is generated as the signal propagating the spatial acoustic paths from the first loudspeaker 3 to the second microphone 10 and the fourth echo 8 which is produced as the signal propagating through spatial acoustic paths from the second loudspeaker 4 to the second microphone 10 are added to the second transmission signal 13 or the voice of the talker 11 received with the second microphone 10, so that a second mixed signal 15 is created.

In order to remove the echoes introduced into the first mixed signal 14, the first adaptive filter 121 receives the first received signal 1 and then creates an echo replica 125 corresponding to the first echo 5. The second adaptive filter 122 receives the second received signal 2 and then creates an echo replica 126 corresponding to the second echo 6. The first subtracter 129 subtracts the echo replicas 125 and 126 corresponding to the first echo 5 and the second echo 6, respectively, from the first mixed signal 14. The first and second adaptive filters 121 and 122 are controlled to minimize the output of the first subtracter 129. The output of the first subtracter 129 becomes the first output signal 16 of the echo canceller 100.

In order to remove the echoes introduced into the second mixed signal 15, the third adaptive filter 123 receives the first received signal 1 and then creates an echo replica 127 corresponding to the third echo 7. The fourth adaptive filter 124 receives the second received signal 2 and then creates an echo replica 128 corresponding to the fourth echo 8. The second subtracter 130 subtracts the replicas 127 and 128 corresponding to the third echo 7 and the fourth echo 8 from the second mixed signal 15, respectively. The third and fourth adaptive filters 123 and 124 are controlled to minimize the output of the second subtracter 130. The output of the second subtracter 130 becomes the second output signal 17 of the echo canceller 100.

In the multi-channel teleconferencing system being one of important applications for multi-channel echo cancellation, plural microphones receives voices of talkers. Hence, received signals by each microphone can be approximately regarded as signals with an attenuation and a delay each depending on the distance between the talker and the microphone. The mutual correlation between received signals in different channels becomes very high. Let us now assume that the second received signal 2 which was generated as a delayed version of the first received signal 1, an echo path which can be modeled as a finite impulse response filter, and an echo canceller based on linear combination with adaptive finite impulse response filters.

It is now assumed that $x_1(n)$ is a first received signal 1 at the time n, $x_2(n)$ is a second received signal 2 at the time n, and $d(n)$ is an echo introduced into the mixed signal 14. When the time differences between the first received signals 1 and the second received signals 2 is $n_d$ (natural number), $X_2(n)$ is expressed by:

$$x_2(n)=x_1(n-n_d) \qquad (1)$$

For simplification, let us now assume that all the spatial acoustic paths ranging from the first and second loudspeakers 3 and 4 to the first and second microphones 9 and 10 are equal in the impulse response length (N). The echo $d(n)$ mixed in the mixed signal 14 is the sum of the echo 5 and the echo 6 and is expressed by:

$$d(n) = \sum_{i=0}^{N-1} h_{1,i}\, x_1(n-i) + \sum_{i=0}^{N-1} h_{2,i}\, x_2(n-i) \qquad (2)$$

where $h_{1,i}$ is an impulse response sample value of a spatial acoustic path ranging from the loudspeaker 3 to the microphone 9, $h_{2,i}$ is an impulse response sample value of a spatial acoustic path ranging from the loudspeaker 4 to the microphone 9, and i is an integer value between 0 and N−1.

When $x_2(n)$ is eliminated by substituting the equation (1) into (2), the following equation (3) is obtained:

$$d(n) = \sum_{i=0}^{n_d-1} h_{1,i} x_1(n-i) + \sum_{i=n_d}^{N-1} (h_{1,i} + h_{2,i-n_d}) x_1(n-i) + \sum_{i=N-n_d}^{N-1} h_{2,i} x_1(n-n_d-i) \qquad (3)$$

The echo replica $\hat{d}(n)$ hat created by each of the adaptive filters 121 and 122 is expressed by:

$$\hat{d}(n) = \sum_{i=0}^{N-1} w_{1,i}(n) x_1(n-i) + \sum_{i=0}^{N-1} w_{2,i}(n) x_2(n-i) \qquad (4)$$

where $w_{1,i}(n)$ is the i-th filter coefficient of the adaptive filter 121 and $w_{2,i}(n)$ is the i-th filter coefficient of the adaptive filter 122.

When $x_2(n)$ is eliminated by substituting the equation (1) into the equation (4), the following equation (5) is obtained:

$$\hat{d}(n) = \sum_{i=0}^{n_d-1} w_{1,i}(n)x_1(n-i) + \quad (5)$$
$$\sum_{i=n_d}^{N-1} \{w_{1,i}(n) + w_{2,i-n_d}(n)\}x_1(n-i) + \sum_{i=N-n_d}^{N-1} w_{2,i}(n)x_1(n-n_d-i)$$

The residual echo e(n) is expressed by:

$$e(n) = d(n) - \hat{d}(n) \quad (6)$$
$$= \sum_{i=0}^{n_d-1} \{h_{1,i} - w_{1,i}(n)\}x_1(n-i) +$$
$$\sum_{i=n_d}^{N-1} \{h_{1,i} + h_{2,i-n_d} - w_{1,i}(n) - w_{2,i-n_d}(n)\}x_1(n-i) +$$
$$\sum_{i=N-n_d}^{N-1} \{h_{2,i} - w_{2,i}(n)\}x_1(n-n_d-i)$$

The condition of completely eliminating echoes from the equation (6) is expressed by:

$$h_{1,i} = w_{1,i}(n) \; i=0, \ldots, n_d-1$$
$$h_{1,i} + h_{2,i-n_d} = w_{1,i}(n) + w_{2,i-n_d}(n) \; i=n_d, \ldots, N-1$$
$$h_{2,i} = w_{2,i}(n) \; i=N-n_d, \ldots, N-1 \quad (7)$$

The following expression is uniquely determined by the equation (7).

$$w_{1,0}(n), \ldots, w_{1,n-1}(n) \text{ and } w_{2,N-n_d}(n), \ldots, w_{2,N-1}(n) \quad [1]$$

However, it is clear that the following expression has an unlimited number of solutions.

$$i \; w_{1,n_d}(n), \ldots, w_{1,N-1}(n) \text{ and } w_{2,0}, \ldots, w_{2,N-n_d-1}(n)[2]$$

Particularly the solutions of the following equation depend on values of $n_d$.

$$w_{1,n_d}(n), \ldots, w_{1,N-1}(n) \text{ and } w_{2,0}, \ldots, w_{2,N-n_d-1}(n) \quad [3]$$

That is, a change of nd caused by a shift of the talker's position leads to a change of the solution. This means that the echo canceling capability is degraded even with no variations in echo path. This creates an obstacle to applications in actual environments. In these discussions, the adaptive filters 121 and 122 used to remove echoes mixed in the mixed signal 14 have been assumed. Similarly, this discussion is applicable to adaptive filters 123 and 124.

In order to solve the above-mentioned problems, there is a multi-channel echo canceling method where adaptive filters, respectively corresponding one to one to mixed signals, create echo replicas in response to one received signal. Thus, one adaptive filter per channel can estimate echoes caused by signals propagating from a single sound source in plural paths. This method was proposed in the IEEE Proceedings of International Conference on Acoustics, Speech and Signal Processing, Vol. 2, 1994, pp. 245–248 (hereinafter referred to as reference 2).

The multi-channel echo canceling method of the reference 2 can avoid indefinite solutions because one adaptive filter removes the echo generated in one channel. As a result, the adaptive filter coefficients are converged to optimum values which are uniquely determined. However, the reference 2 discloses evaluation results proving the fact that the echo suppression is degraded when the parameters determined by the environment in use such as the locations of microphones receiving the taker's voice are not within a certain range. Hence, a multi-channel echo canceller based on linear combination has to be used, by considering the use in a wide variety of environments.

Based on the above-mentioned premise, there is a method of uniquely determining the adaptive filter coefficients, for a multi-channel echo canceller based on linear combination, where the received signal is delayed and then is alternately selected as a new received signal the delayed signal in place of the received signal. This method was proposed in Technical Report, the Institute of Electronics, Information and Communication Engineers of Japan, Vol. DSP97-1, 1997, pp. 1–8 (hereinafter referred to as reference 3). In this multi-channel echo canceling method, the number of conditions used to calculate adaptive filter coefficients is increased because of the introduction of the delayed received signals, therefore, indefinite solutions do not occur. As a result, the adaptive filter coefficients converge to optimum values which are uniquely determined. However, shift of the acoustic image may often be perceived when the received signal is switched between the original and its delayed version. In order to overcome such a problem, there is a method of correcting the magnitudes of signals in both channels when the received signal and the delayed received signal are switched. This method was proposed in the Proceedings of the 12-th digital signal processing symposium of the Institute of Electronics, Information and Communication Engineers of Japan, 1997, pp. 531–536 (hereinafter referred the as reference 4). Moreover, there is a method that can uniquely determine adaptive filter coefficients by applying non-linear processing to the received signals in both channels, instead of switching the received signal and the delayed received signal. This method was proposed in the Proceedings of the IEEE International Conference on Acoustic, Speech and Signal Proceeding, Vol. 1, 1997, pp. 303–306 (hereinafter referred to as reference 5). However, the method disclosed in the reference 4 provides a slow convergence rate, compared with the multi-channel echo canceller based on linear combination. Moreover, the Proceeding of the IEEE International Conference on Acoustics, Speech and Signal Processing, Vol. 6, 1998, pp. 3677–3680 (hereinafter referred to as reference 6) discloses that the method in the reference 5 provides a slower convergence rate, compared with the method in the reference 4.

As described in detail by referring to FIG. 24, the conventional multi-channel echo canceling method or apparatus has the disadvantage in that the solutions to adaptive filter coefficients are indefinite and are not guaranteed to be equal to the solutions uniquely determined by the impulse responses in the echo paths. Moreover, in the method proposed in the reference 3, a shift of an acoustic (or sound) image may often be perceived when the received signal or the delayed received signal is selected. Moreover, in the methods proposed in the references 4 and 5, the convergence is slow, compared with the conventional multi-channel echo canceling method or apparatus.

SUMMARY OF THE INVENTION

The objective of the invention is to provide a multi-channel echo canceling method or apparatus with an excellent sound quality and a short convergence time, wherein the coefficient values of the adaptive filters are converged to correct values which are uniquely determined by the impulse responses of the echo paths.

In the multi-channel echo canceling apparatus according to the present invention, received signals are non-linearly processed while one obtained by delaying a received signal is used as a new received signal.

Specifically, the multi-channel echo canceling apparatus has magnitude processing circuits (605 and 606 in FIG. 1) for non-linearly processing received signals 1 and 2 and a delay processing circuit (200 in FIG. 1) for delaying the received signal 2 and then supplying the delayed signal to adaptive filters 122 and 124 and to a digital-to-analog converter (DAC) 19.

Furthermore, the multi-channel echo canceling apparatus non-linearly processes the received signals. The multi-channel echo canceling apparatus also uses a delayed received signal as a new received signal and applies magnitude correction to the other input signals.

Specifically, the multi-channel echo canceling apparatus has a magnitude processing circuit (605 in FIG. 17) for non-linearly processing the received signal 2, a delay processing circuit (300 in FIG. 17) for delaying a non-linearly processed signal and then supplying the delayed signal to the adaptive filters 122 and 124 and the digital-to-analog converter 19, a magnitude processing circuit (606 in FIG. 17) for non-linearly processing the received signal 1, and a magnitude compensating circuit (400 in FIG. 17) for correcting the magnitude of the non-linearly processed signal and then supplying the corrected signal to the adaptive filters 121 and 123 and the digital-to-analog converter 18.

In the multi-channel echo canceling apparatus or method according to the present invention, one received signal is filtered to create a supplement signal. The adaptive filter is operated using a new signal obtained by time-multiplexing an original received signal and the created supplement signal. A plurality of adaptive filters estimate echoes caused by propagating from one signal source in plural paths. For that reason, an increase in the number of conditions for solving adaptive filter coefficients makes solutions definite eliminating the existing problem of indefinite coefficients. Hence, the adaptive filter coefficients are converged to optimum values which are uniquely determined. Moreover, the multiplex parameters of the original received signal and the supplement signal are controlled based on the nature of the received signal while movement of the sound image caused by introducing the supplement signal is canceled in the magnitude correction process to the input signal. Hence, degradation of the sound quality of the audible received signal directly supplied to the loudspeaker is suppressed so that a good sound quality can be maintained. Moreover, the synergistic effect of introducing the non-linear processing and the supplement signal can shorten the convergence time.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Embodiments of the present invention will be described in detail below with reference to FIGS. 1 to 23. It is now assumed to use a two-channel acoustic echo canceller that has a first received signal, a second received signal, a first mixed signal and a second mixed signal. This acoustic echo canceller can remove acoustic echoes caused by received signals propagating from a loudspeaker to a microphone via a spatial acoustic path.

Figure 1:
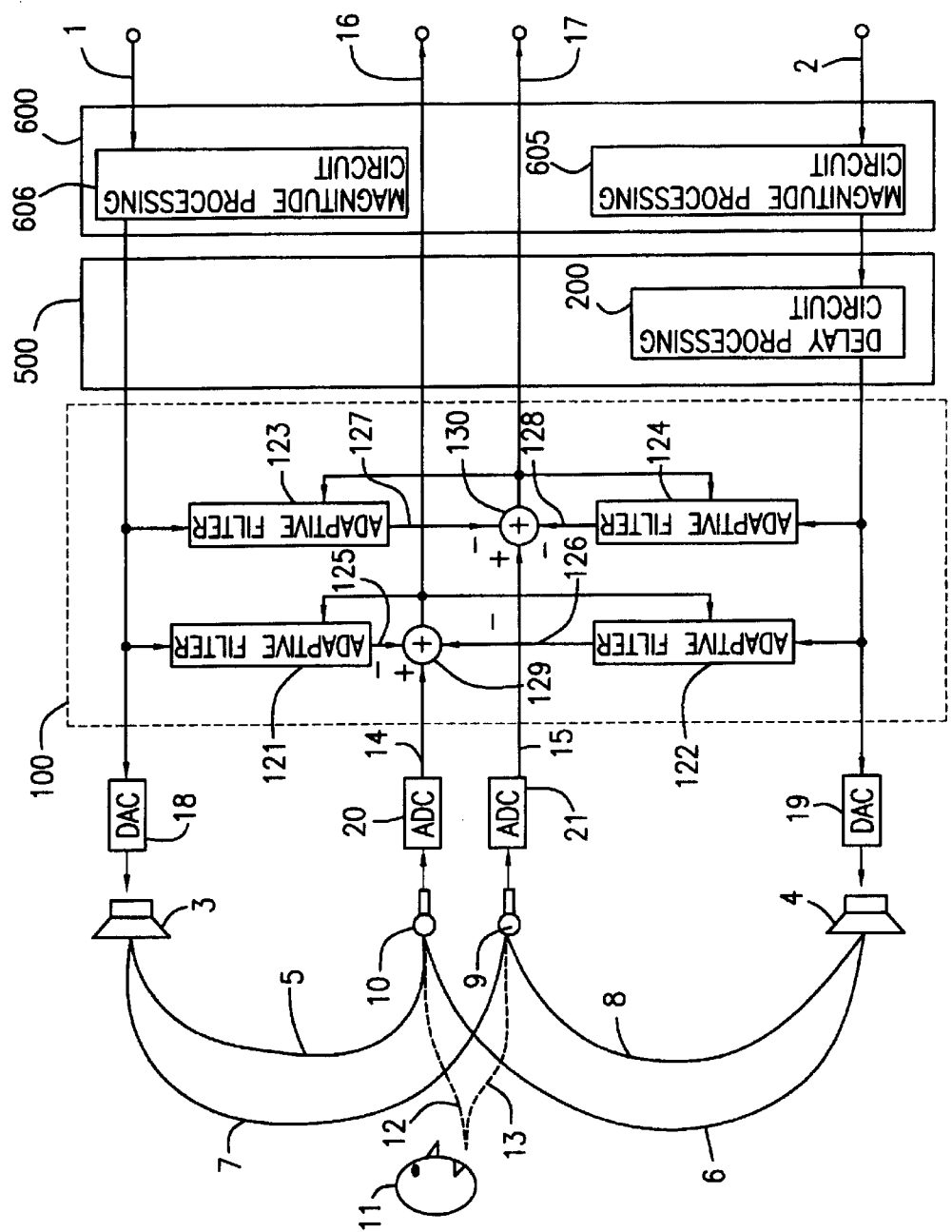
FIG. 1 is a block diagram of a multi-channel echo canceller according to a first embodiment of the present invention.

FIG. 1 shows a multi-channel echo canceller with two received signals and two transmission signals, according to an embodiment of the present invention. This multi-channel echo canceller differs from the multi-channel echo canceller based on linear combination of FIG. 24 in that the non-linear processing circuit 600 and the pre-processing circuit 500 process the received signal 2 supplied to the adaptive filters 122 and 124. The first mixed signal 14 and the second mixed signal 15 are created in a similar manner to that of the multi-channel echo canceller based on linear combination shown in FIG. 24. In the non-linear processing circuit 600, the magnitude processing circuit 605 non-linearly processes the received signal 2 while the magnitude processing circuit 606 non-linearly processes the received signal 1. The first and the second received signals 1 and 2, which are non-linearly processed, are transferred to the processing circuit 500. If there is a slight difference between the received signals 1 and 2, the non-linear process enlarges it, thus, reducing the correlation between the received signals in these channels. This means that the adaptive filter coefficients are properly identified. However, as described earlier, the non-linear processing alone results in a slow convergence rate. For that reason, it is intended to further reduce the correlation between channels by additionally using the pre-processing circuit 500. The delay processing circuit 200 in the pre-processing circuit 500 processes the output of the non-linear processing circuit 600 and then transmits the delayed process signal to the adaptive filters 122 and 124 and the digital-to-analog converter (DAC) 19.

Figure 2:
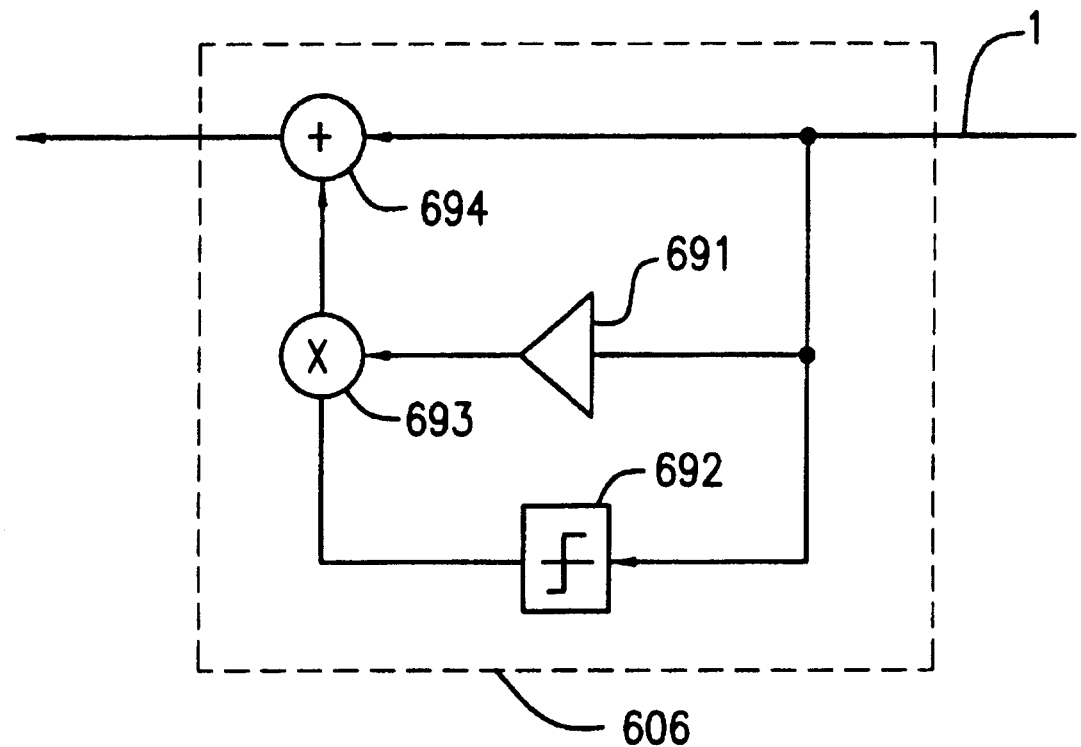
FIG. 2 is a block diagram illustrating the configuration of the magnitude processing circuit 605 or 606.

FIG. 2 is a block diagram illustrating the configuration of the magnitude processing circuit 605 or 606. The magnitude processing circuit 606 consists of the coefficient multiplier 691 and the polarity detection circuit 692 each receiving the received signal 1. The coefficient multiplier 691 multiplies the input signal, or the received signal 1, by $\alpha$. The polarity detection circuit 692 outputs 1 when the polarity of the input signal is positive and 0 when the polarity of the input signal is negative. The multiplier 693 receives the output of the coefficient multiplier 691 and the output of the polarity detection circuit 692, and outputs the product to the adder 694. The adder 694 has the other input terminal receiving the received signal 1 without any change. That is, with respect to the n-th received signal sample $x_1(n)$, the adder 694 outputs either $(1+\alpha)x_1(n)$ when the polarity of the input signal is positive or $x_1(n)$ when the polarity of the input signal is negative. Similarly, the magnitude processing circuit 605 outputs either $(1+\alpha)x_2(n)$ when the polarity of the input signal is positive or $x_2(n)$ when the polarity of the input signal is negative.

Figure 3:
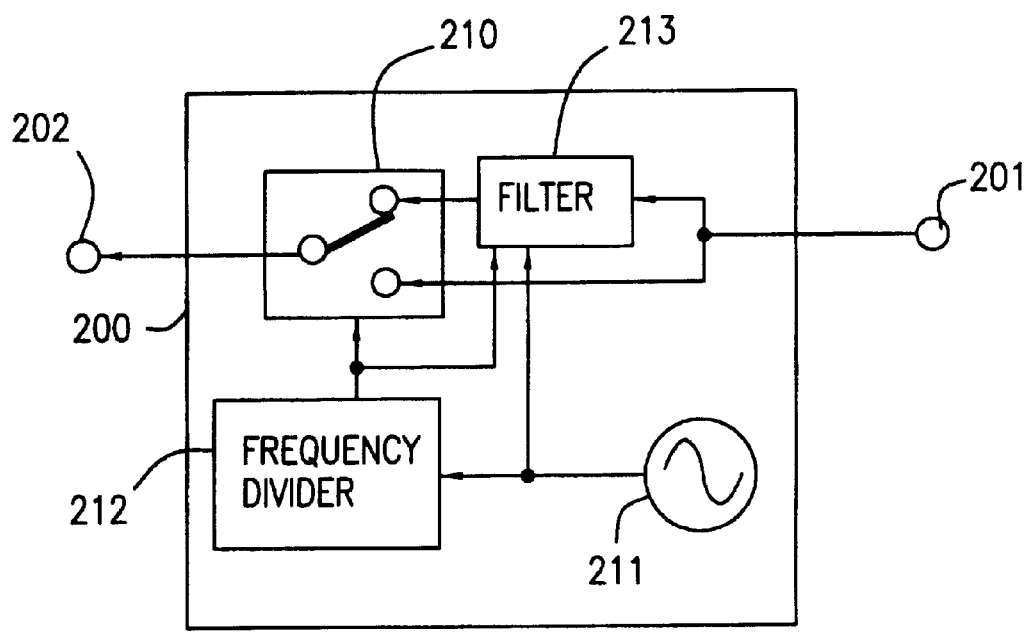
FIG. 3 is a block diagram illustrating a first configuration of the delay processing circuit 200.

FIG. 3 is a block diagram illustrating the configuration of the delay processing circuit 200. The magnitude processing circuit 605 inputs its output signal to one input terminal of the switch 210 and the filter 213 via the input terminal 201. The filter 213 filters the signal from the magnitude processing circuit 605 and then inputs the filtered signal to the other input terminal of the switch 210. In other words, the signal from the magnitude processing circuit 605 and the signal obtained by filtering the signal from the magnitude processing circuit 605 with the filter 213 are respectively supplied to the two input terminals of the switch 210. The frequency divider 212 inputs a control signal to the switch 210. The control signal is created by frequency-dividing the clock signal from the clock signal generator 211. Rectangular pulses with the period equal to the sampling period T of the received signal 2 are generated as the clock signal. Only for convenience in explanation, the clock signal generator 21 is shown in FIG. 3. Actually, it is rare to have a dedicated clock signal generator in the delay processing circuit 200. In this case, a common clock signal to the whole system is supplied to the frequency divider 212 from outside of the delay processing circuit 200. If the frequency divider 212 is a 1/M frequency divider for dividing the frequency of the input signal with a factor of 1/M, the frequency divider 212 alternately outputs a level of "1" and a level of "0" to the switch 210 with a period of MT/2. The switch 210 selects the signal from the magnitude processing circuit 605 or the output signal from the filter 213 in synchronism with the leading edge of a rectangular pulse from the frequency divider 212 to transfer it to the output terminal 202. The signal delayed by the above-mentioned procedure is output as a pre-processed signal from the output terminal 202.

Figure 4A:
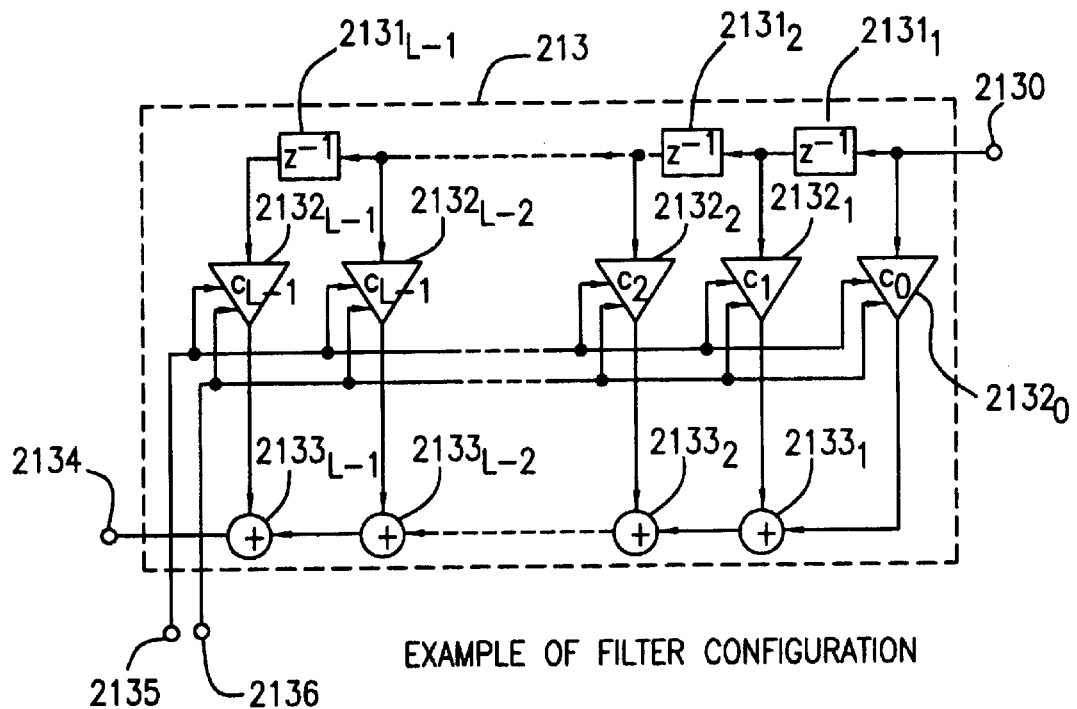
FIGS. 4A and 4B are block diagrams illustrating the configuration of the filter 213.
Figure 4B:
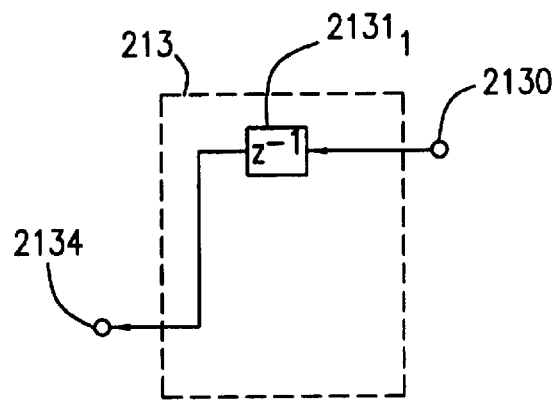

FIG. 4A is a block diagram illustrating the configuration of the filter 213. Here, an L-tap FIR (Finite Impulse Response) filter is assumed as the filter 213. However, another type of a filter such as an IIR filter may also be used as the filter 213. Referring to FIG. 4A, the input terminal 2130 receives the output signal from the magnitude processing circuit 605 of FIG. 1. The signal of the output terminal 2134 is supplied to the switch 210 of FIG. 3. The signal of the input terminal 2130 is input to the delay element 2131, and the coefficient multiplier $2132_0$. Each of delay elements $2131_1, 2131_2, \ldots, 2131_{L-1}$ is a unit delay element for delaying the input signal by one sample. The delay elements are connected in cascade to form a tapped delay line with L taps. The coefficient multipliers $2132_0, 2132_1, \ldots, 2132_{L-1}$ have coefficients $c_0, c_1, \ldots, c_{L-1}$, respectively. For L=2, $c_0=0$ and $c_1=1$, the filter 213, for example, consists of only the delay element $2131_1$, as shown in FIG. 4B. For M=1, that is, for the case where the frequency divider 212 of FIG. 2 does not divide the frequency, the embodiment of the present invention shown in FIG. 4B is equivalent to the method disclosed in the Technical Report of the Institute of Electronics, Information and Communication Engineers of Japan, Vol. DSP96-100, 1996, pp. 17–24 (reference 7). The reference 7 analytically shows that the adaptive filter coefficients are uniquely determined.

Let us now consider M>1. In this case, it is apparent that the number of conditionals for calculating the adaptive filter coefficients is the same as that for M=1. Consequently, the adaptive filter coefficients can be uniquely determined. Even general cases, where the filter 213 cannot be expressed by L=2, $c_0=0$ and $c_1=1$, can be handled in a similar manner. When the output of the filter 213 is equivalent to the input signal, that is, the filter 213 is expressed by L=1 and $c_0=1$, the output of the delay processing circuit 200 depends on the status of the switch 210. Consequently, the number of conditionals for calculating adaptive filter coefficients is equal to the case where the filter 213 is expressed by L=2, $c_0=0$ and c1=1. Thus, the adaptive filter coefficients can be uniquely determined.

Except for M=infinite, discontinuity occurs in the output of the switch 210 caused by the switching operation of the switch 210. This signal discontinuity is subjectively perceived as a noise. The frequency of the noise is inversely proportional to the value of M. As M has a large value, it is more difficult to perceive the signal discontinuity, compared with M of a small value, however, the perception itself is unavoidable. The reference 3 discloses that the noise can be suppressed by time-varying coefficients $c_j$ (where j=0, 1, . . . , L-1) of the filter 213, together with an example of how to control the time-varying coefficients.

As the coefficient update algorithm for the adaptive filters 121, 122, 123 and 124, the LMS algorithm is disclosed in the "Adaptive Signal Processing", 1985, pp. 99–113, Prentice-Hall Inc., USA (hereinafter referred to as reference 8) and the normalized LMS (NLMS) algorithm is disclosed in "Adaptive Filters", 1985, pp. 49–56, Kulwer Academic Publications, USA (hereinafter referred to as reference 9). It is now assumed that the adaptive filters 121 and 122 are controlled using the LMS algorithm with the same step sizes. The i-th coefficient of the adaptive filter 121 $w_{1,i}(n+1)$ after the (n+1)-th adaptation is expressed by its value $w_{1,i}(n)$ after the n-th adaptation, as follows:

$$w_{1,i}(n+1)=w_{1,i}(n)+\mu e_1(n)x_1(n-i) \quad (8)$$

The i-th coefficient of the adaptive filter 122 $w_{2,i}(n+1)$ after the (n+1)-th adaptation is expressed by its value $w_{2,i}(n)$ after the n-th adaptation, as follows:

$$w_{2,i}(n+1)=w_{2,i}(n)+\mu e_2(n)x_1(n-n_d-i) \quad (9)$$

This is applicable to the coefficient adaptation of the adaptive filters 123 and 124.

Figure 5:
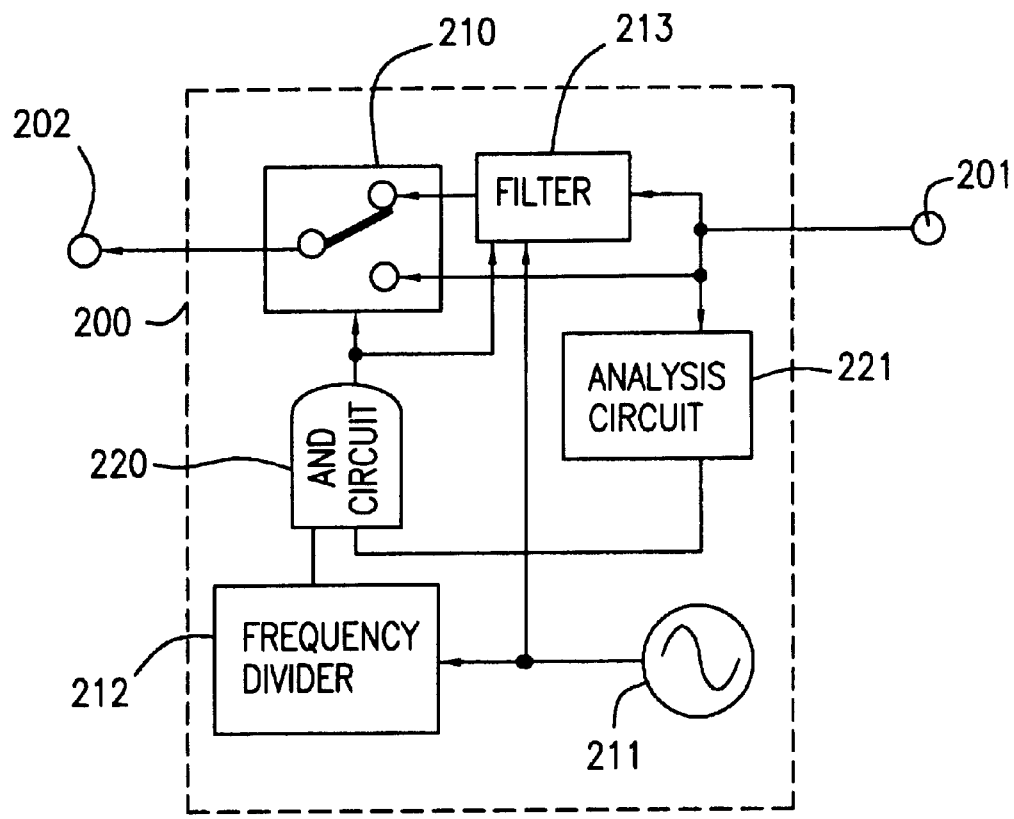
FIG. 5 is a block diagram of illustrating the second configuration of the delay processing circuit 200.

FIG. 5 is a block diagram illustrating the delay processing circuit 200 having a second configuration. The second configuration differs from the first configuration of FIG. 3 in that the delay processing circuit 200 has an analysis circuit 221 and an AND circuit 220, in addition to the frequency divider 212. In the first configuration of FIG. 3, the switch 210 changes its status every M samples. However, in the configuration of FIG. 5, the switch 210 changes its status according to the logical product of the output signal of the frequency divider 212 and the output signal from the analysis circuit 221. The analysis circuit 221 analyzes the output signal from the magnitude processing circuit 605. The analysis circuit 221 produces "1" when the analyzed result satisfies a predetermined condition and produces "0" when the analyzed result does not satisfy the predetermined condition, then, outputting it to the AND circuit 220. The frequency divider 212 supplies a control signal "0" or "1" to the AND circuit 220. The AND circuit 220 detects that the outputs from the analysis circuit 221 and the frequency divider 212 are identical, i.e. the time information coincides with a period of M samples and the analysis results of the input satisfies the predetermined condition simultaneously and then outputs the signal to control the switching of the switch 210.

Various methods may be considered to analyze the output of the magnitude processing circuit 605 with the analysis circuit 221. For example, upon focusing on the suppression of subjective noises due to signal discontinuity, variations in magnitude of the output signal of the magnitude processing circuit 605 may be detected.

Figure 6:
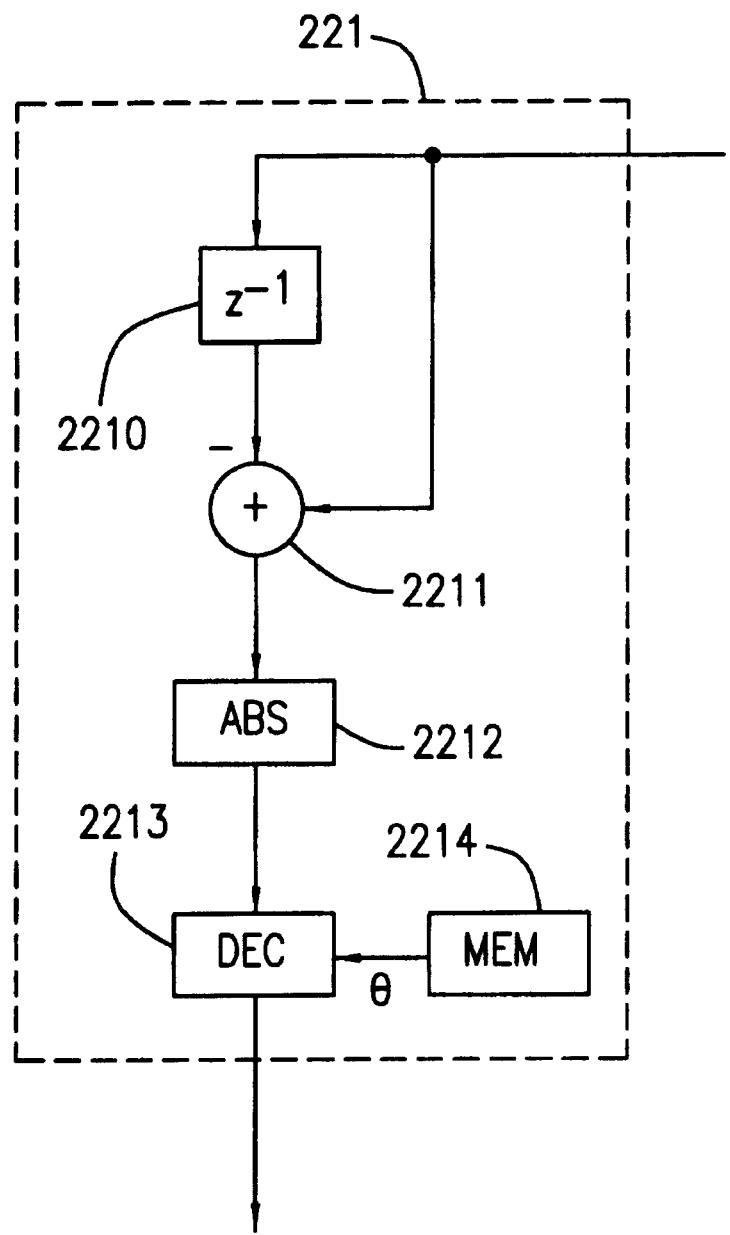
FIG. 6 is a block diagram illustrating the analysis circuit 221 according to a first embodiment of the present invention.

FIG. 6 shows the analysis circuit according to the first embodiment.

Referring to FIG. 6, the analysis circuit 221 consists of a delay element 2210, a subtracter 2211, an absolute value circuit 2212, a decision circuit 2213, and a memory 2214. The delay element 2210 and the subtracter 2211 receive the output signal from the magnitude processing circuit 605, that is, the input signal to the analysis circuit 221. The delay element 2210 delays the input signal by one sample period and then outputs the delayed signal to the subtracter 2211. The subtracter 2211 subtracts the output signal of the delay element 2210 from the output signal of the magnitude processing circuit 605 and then outputs the difference to the absolute value circuit 2212. The absolute value circuit 2212 obtains the absolute value of its input and outputs the result to the decision circuit 2213. The memory 2214 supplies a threshold value θ to the decision circuit 2213. The decision circuit 2213 outputs "1" when the signal from the absolute value circuit 2212 is smaller than the threshold value and otherwise outputs "0". The decision circuit 2213 outputs its output to the AND circuit 220 of FIG. 5. Namely, when variations in magnitude of the output signal of the magnitude processing circuit 605 are small, the switch 210 changes its status.

Figure 7:
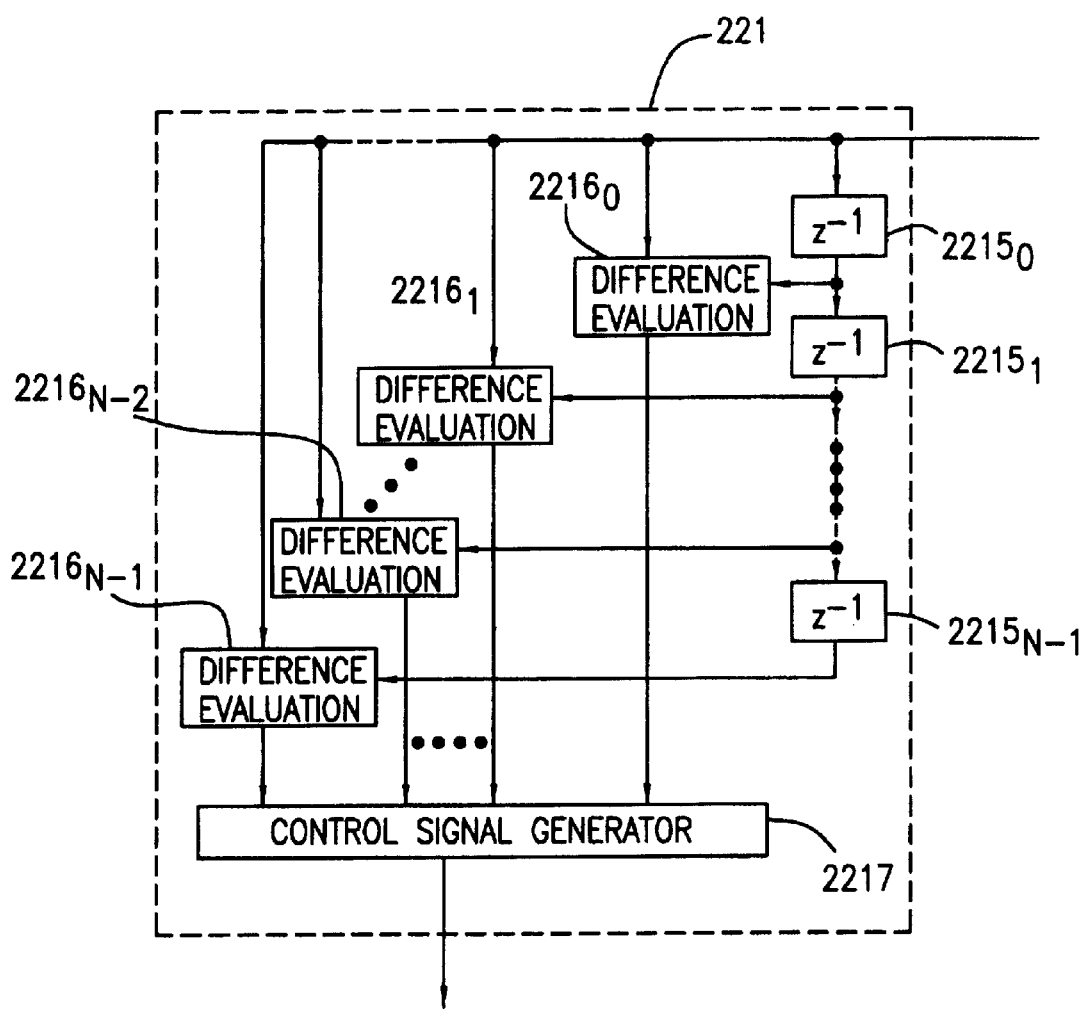
FIG. 7 is a block diagram illustrating the analysis circuit 221 according to a second embodiment of the present invention.

FIG. 7 shows the analysis circuit 221 based on a post masking, according to the second embodiment. The post masking is a phenomenon in which signal samples with a small magnitude following a certain signal sample cannot be perceived by a human's ear. Post masking is described in detail in "Pcychoacoustics" by Zwicker, translated by Yamada, published by Nishmura Syoten, 1992, pp. 132–146 (reference 10). Referring to FIG. 7, the analysis circuit 221 consists of a group of delay elements $2215_0$, $2215_1$, ..., $2215_{N-1}$, a group of difference evaluation circuits $2216_0$, $2216_1$, ..., $2216_{N-1}$, and a control signal generator 2217. N is a positive integer. The magnitude processing circuit 605 outputs its output signal to the delay element 2215, and the difference evaluation circuit $2216_0$. Delay elements $2215_0$, $2215_1$, ..., $2215_{N-1}$ form a tapped delay line which delays the supplied signal by one sample period.

The difference evaluation circuit $2216_0$ evaluates the difference between the output signal from the magnitude processing circuit 605 and the signal supplied from the delay element $2215_0$ and outputs the result to the control signal generator 2217. Difference evaluation can be performed by subtracting the output signal from the magnitude processing circuit 605 from the signal supplied from the delay element $2215_0$.

Then, "1" is output when the result is larger than a predetermined threshold value $\delta_0$.

"0" is output when the result is smaller than the predetermined threshold value $\delta_0$. Moreover, by subtracting the absolute value of an output signal from the magnitude processing circuit 605 from the absolute value of a signal supplied from the delay element $2215_0$, "1" is output when the result is larger than a predetermined threshold value $\epsilon_0$ and "0" is output when the result is smaller than a predetermined threshold value $\epsilon_0$.

Similarly, each of the difference evaluation circuits $2216_0$, $2216_1$, ..., $2216_{N-1}$ evaluates the difference between the signal supplied from the corresponding delay element and the output signal from the magnitude processing circuit 605 and then outputs the result to the control signal generator 2217. The control signal generator 2217 creates a control signal using evaluation results of difference supplied from the difference evaluation circuits. The control signal, for example, can be created based on a coincidence among the input signals from the difference evaluation circuits. That is, "1" is output for a coincidence while "0" is output for a non-coincidence. The majority of signals from the differential evaluation circuits may be used as a control signal. When "1" holds the majority, "1" is output. When "1" holds a minority, "0" is output. As another example, respective input signals may be multiplied by a predetermined independent constant. The sum of the multiplication results is compared with a predetermined threshold. When the sum is larger than the threshold value, "1" is output. Otherwise, "0" is output. It is apparent that the control signal generator 2217 may use a coincidence between respective multiplication results or their majority. In the above-mentioned procedure, when the magnitude of the output from the magnitude processing circuit 605 decreases below the past value, the switch changes its state.

The reference 10 discloses pre-masking as a similar phenomenon to post masking. Pre-masking is a phenomenon in which signals with a small magnitude are masked by signals consecutive thereto, thus, are inaudible by a human's ear. In order to detect pre-masking, the whole samples of the signal must be delayed. That is, delay elements must be inserted in the two input paths for the switch 210 shown in FIG. 5. In association with the insertion of delay elements, delay elements with a corresponding delay amount are inserted in the path for the received signal 1 before the adaptive filters 121 and 123 to adjust the delay of the received signal 1. The delay amounts of the delay elements depend on the time required for pre-masking detection. For example, at least a 2-sample delay is required to detect the pre-masking due to the signal delayed by 2 samples. In the calculation by the difference evaluation circuits $2216_0$, $2216_1, \ldots, 2216_{N-1}$ shown in FIG. 7, the outputs must be inverted. That is, "0" is output when "1" is to be originally output while "1" is output when "0" is to be originally output. This inversion allows pre-masking to be detected. In the above-mentioned procedure, the switch 210 changes immediately its state before the magnitude of the output signal of the magnitude processing circuit 605 increases.

In the configuration of FIG. 5, at least for M sample after the output signal of the frequency divider 212 does not match with the output of the analysis circuit 221, the switch 210 cannot change its state. That is, the switching period of the switch 210 is limited to an integer multiple of M. The delay processing circuit 200 may be constructed such that the switching period of the switch 210 is not limited to an integer multiple of M.

Figure 8:
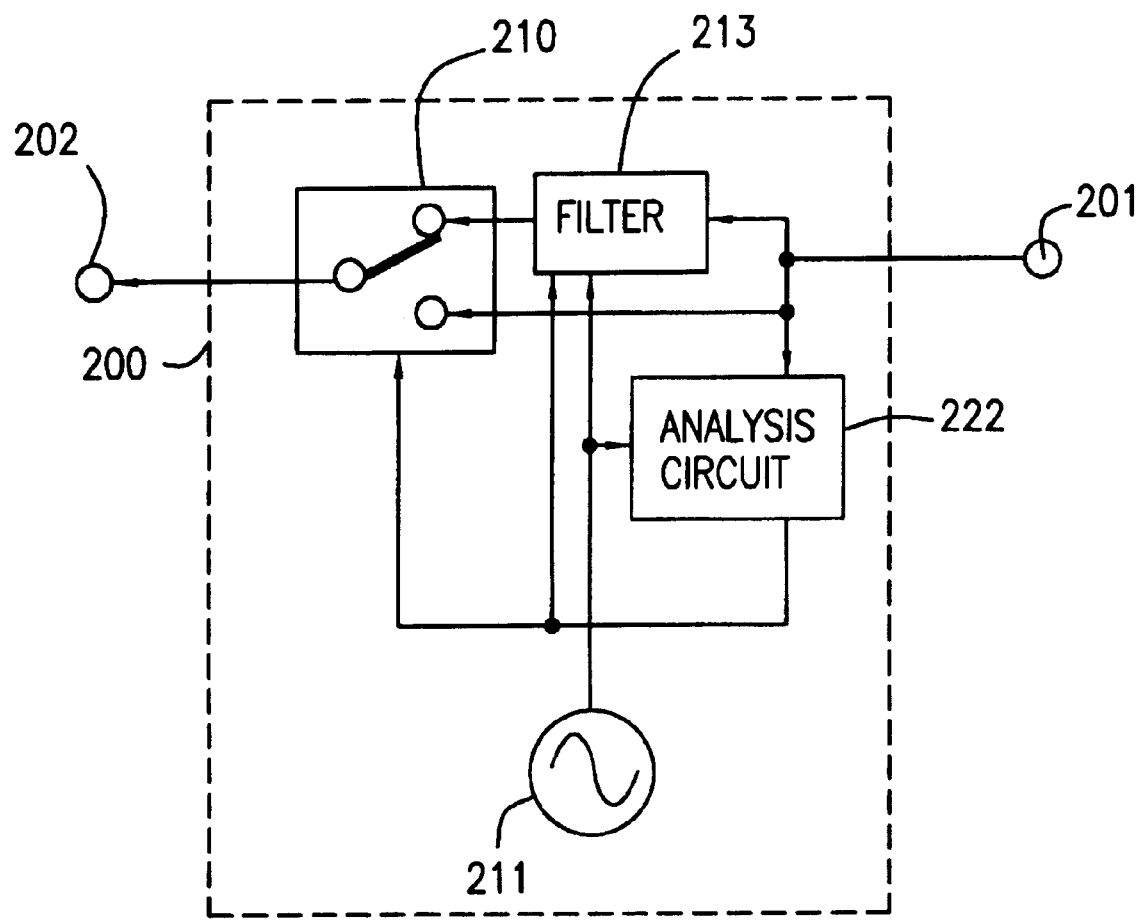
FIG. 8 is a block diagram illustrating the third configuration of the delay processing circuit 200.

FIG. 8 is a block diagram illustrating the delay processing circuit 200 with the third configuration. This configuration differs from the second configuration of FIG. 5 in that a new analysis circuit 222 is added instead of the frequency divider 212, the analysis circuit 221 and the AND circuit 220. In the configuration of FIG. 5, the switch 210 is controlled by the logical AND between the output of the frequency divider 212 and the output of the analysis circuit 221. However, in the configuration of FIG. 8, the analysis circuit 222 analyzes the output signal of the magnitude processing circuit 605 and then directly creates a control signal for the switch 210 using the analysis result and rectangular pulses. The rectangular pulses are supplied from the clock generation circuit 211 to the analysis circuit 222.

The analysis circuit 222 performs basically the same analysis as the analysis circuit 221. The analysis circuit 222 can detect a variance in magnitude of the output signal from the magnitude processing circuit 605 or can perform analysis based on the pre/post masking. When the analysis result indicates that the output signal of the magnitude processing circuit 605 satisfies predetermined conditions and a predetermined sampling period ($M_2T$) or more has passed from the immediate previous switching operation, the analysis circuit 222 outputs a control signal of "1". $M_2$ is a positive integer satisfying $M_2>1$. In other cases, the analysis circuit 222 outputs a control signal of "0". The analysis circuit 222 outputs the control signal to the switch 210 to control the switching thereof. Specifically, the sampling period is evaluated by counting the rectangular pulses with a counter and then comparing the count with the value $M_2$ stored in a memory. If the count is equal to the value $M_2$, it is judged that the sampling period ($M_2T$) has passed. Thus, the analysis circuit 222 outputs "1" while the counter is reset.

In order to suppress the subjective noise due to signal discontinuity, a case with time-varying the coefficients $c_j$ (where j=0, 1, ..., L-1) of the filter 213 has been explained for L=2, using FIG. 3. However, the delay process circuit 200 without the switch 210 in FIG. 2, 5 or 8 may be used instead by suitably setting the coefficients $c_0(k)$ and $c_1(k)$.

Figure 9:
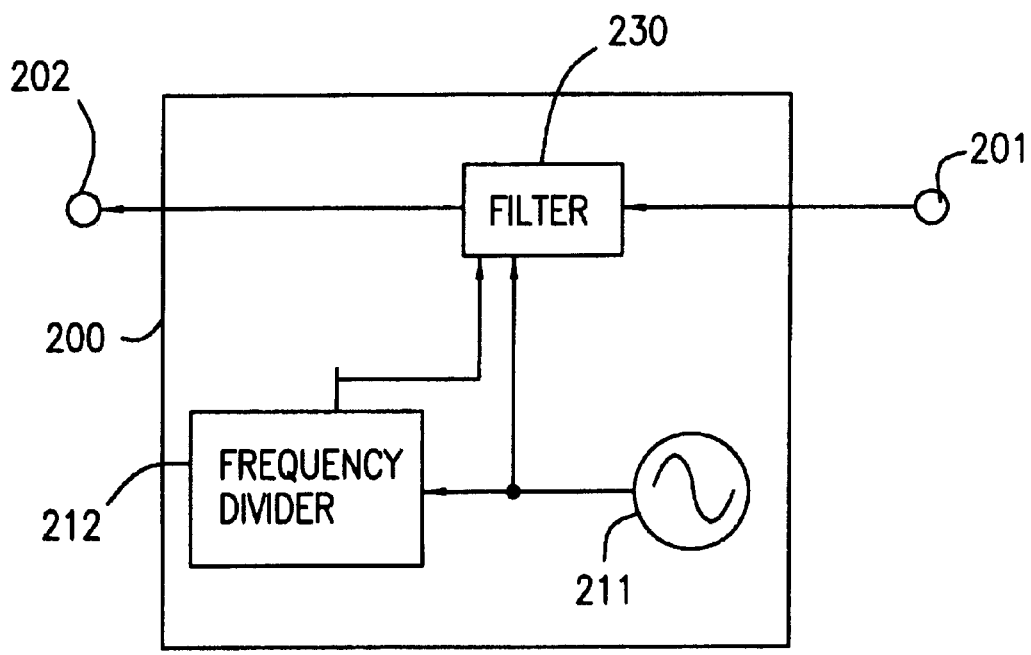
FIG. 9 is a block diagram illustrating the fourth configuration of the delay processing circuit 200.

FIG. 9 is a block diagram illustrating the delay processing circuit 200 with the fourth configuration. The filter 230 receives the received signal 2 via the input terminal 201. The filter 230 filters the received signal 2 and outputs the filtered signal to the output terminal 202. The clock generation circuit 211 and the frequency divider 212 respectively input control signals to the filter 230. The clock generation circuit 211 generates rectangular pulses of a period equal to the sampling period T of the received signal 2. The frequency divider 212 supplies the control signal obtained by frequency-dividing the clock from the clock generation circuit 211. The filter 230 controls the time-varying coefficient based on the control signals.

Figure 10:
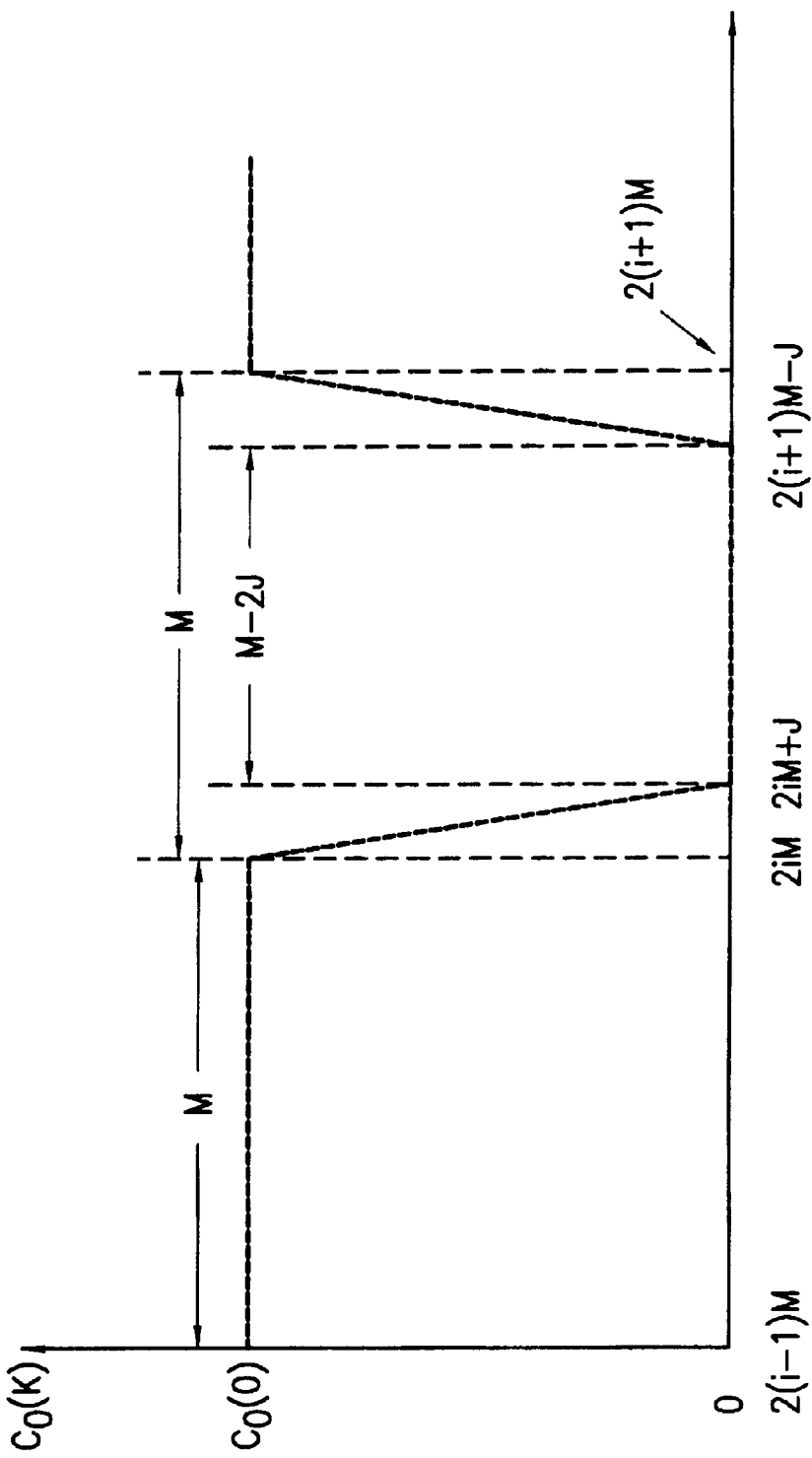
FIG. 10 is a graph plotting the time-varying the coefficient $c_o(k)$ of the coefficient multiplier of the filter shown in FIG. 3.

For L=2 in FIG. 4A, $c_0(k)$ is shown in FIG. 10. $C_1(k)$ is expressed by:

$$c_1(k) = 1 - c_0(k) \qquad (10)$$

where I is an arbitrary natural number.

$c_0(k)$ takes $c_0(0)$ and 0 alternately with a period of 2 MT. Strictly, only the first JT and the last JT in a zero-valued range the value of $c_0(k)$ directly changes from $c_0(0)$ to 0 or from 0 to $c_0(0)$. Since $c_1(k)$ is given by the equation (10), either $c_0(k)$ or $c_1(k)$ is zero while the other is non-zero, almost over the whole period of time. That is, $c_0(k)$ and $c_1(k)$ are exclusive to each other. A similar switching operation to that of the switch 210 can be executed without the switch 210 of FIG. 3. It may be considered that L≠2 corresponds to taps of the filter 230 connected in parallel. In other words, $c_0(k)$ and $c_1(k), c_2(k), \ldots, c_{L-1}(k)$ are exclusive to each other. When one coefficient is zero, the other coefficients become non-zero. Each of $c_1(k), c_2(k), \ldots, c_{L-1}(k)$ and the corresponding vale of J may respectively have a different value.

Figure 11:
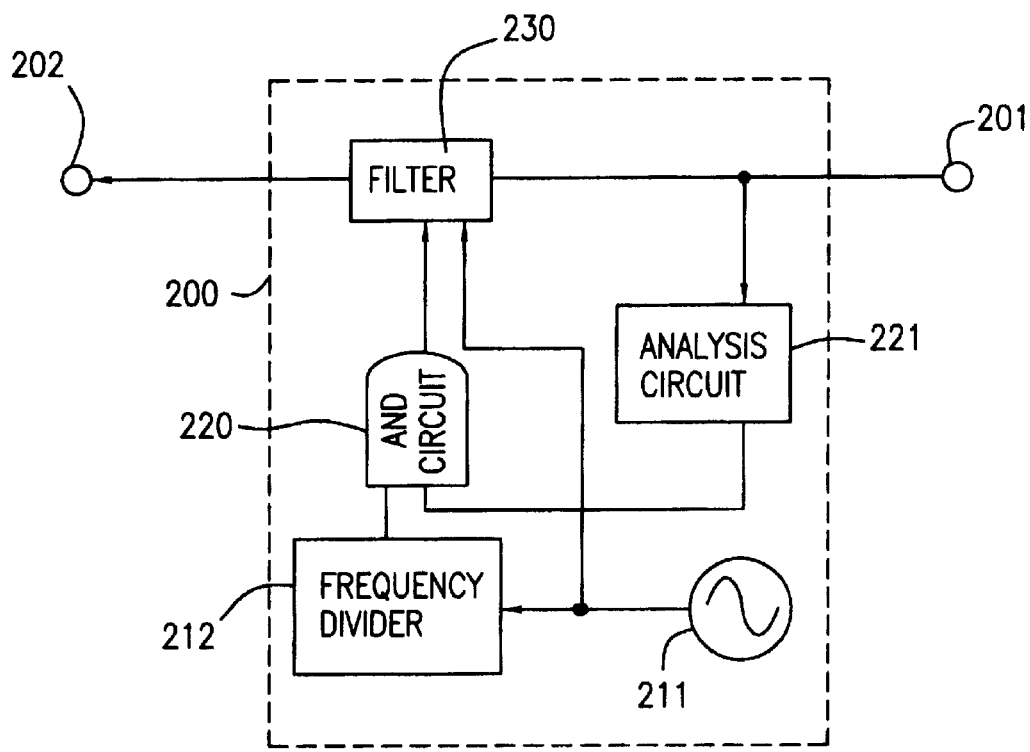
FIG. 11 is a block diagram illustrating the fifth configuration of the delay processing circuit 200.

FIG. 11 is a block diagram illustrating the delay processing circuit 200 with the fifth configuration. The filter 203 receives the output signal of the magnitude processing circuit 605 input via the input terminal 201. The filter 203 filters the output signal from the magnitude processing circuit 605 and then outputs the filtered signal to the output terminal 202. The filter 230 also receives the control signals from the clock generation circuit 211 and the AND circuit 220. The AND circuit 220 receives the signal from the analysis circuit 211 and the signal from the frequency divider 212. The clock generation circuit 211 generates rectangular pulses with a period equal to the sampling period T of the output signal from the magnitude processing circuit 605. The frequency divider 212 supplies a control signal to the AND circuit 220. The control signal is created by frequency-dividing the clock from the clock generation circuit 211. The analysis circuit 221 analyzes the output of the magnitude processing circuit 605 and then outputs "1" to the AND circuit 220 when the result of the analysis satisfies a predetermined condition and "0" to the AND circuit 220 when the result of the analysis does not satisfy the predetermined condition. As described earlier, the AND circuit 220 receives a control signal of "0" or "1" from the frequency divider 212. The AND circuit 220 detects that the output of the analysis circuit 221 is identical to the output of the frequency divider 212. That is, the time information coincides with the M sample periods and the analysis result on the input signal satisfies the predetermined conditions. Then, the AND circuit 220 outputs its output signal to the filter 230. The filter 230 controls the time-varying coefficients based on the control signals.

Figure 12:
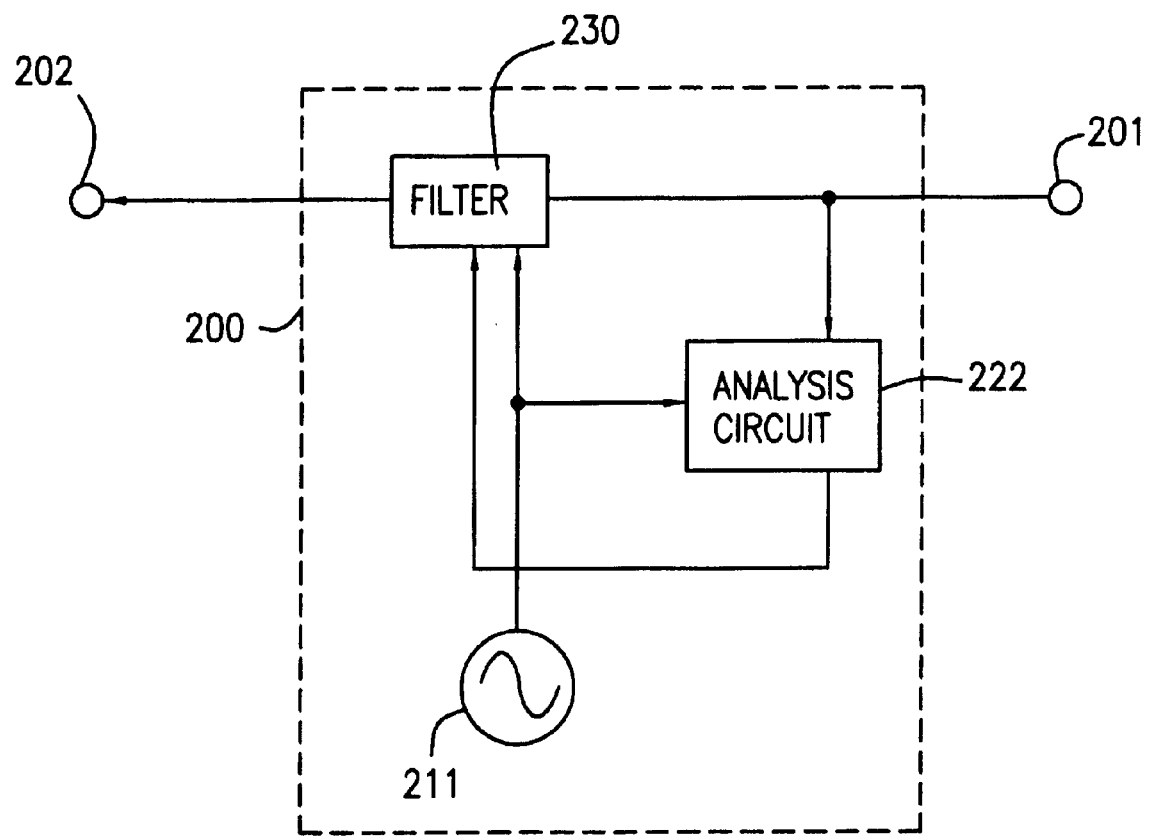
FIG. 12 is a block diagram illustrating the sixth configuration of the delay processing circuit 200.

FIG. 12 is a block diagram illustrating the delay processing circuit 200 with the sixth configuration. This configuration differs from the fifth configuration (described with FIG. 1) in that a new analysis circuit 222 is added instead of the frequency divider 212, the analysis circuit 221 and the AND circuit 220. That is, in the configuration of FIG. 11, the time-varying coefficients of the filter 230 are controlled by the logical AND between the output signals of the frequency divider 212 and the analysis circuit 221. However, in the configuration of FIG. 12, the analysis circuit 222 analyzes the output signal of the magnitude processing circuit 605. Then, the control signals for the filter 230 are directly created using the analysis result and the rectangular pulses supplied from the clock signal generation circuit 211 to the analysis circuit 222.

The pre-processing circuit 500, which has the delay processing circuit 200 receiving the received signal 2, has been described by referring to FIG. 1. The pre-processing circuit 500 may have the delay processing circuit 200 which receives the received signal 1.

Figure 13:
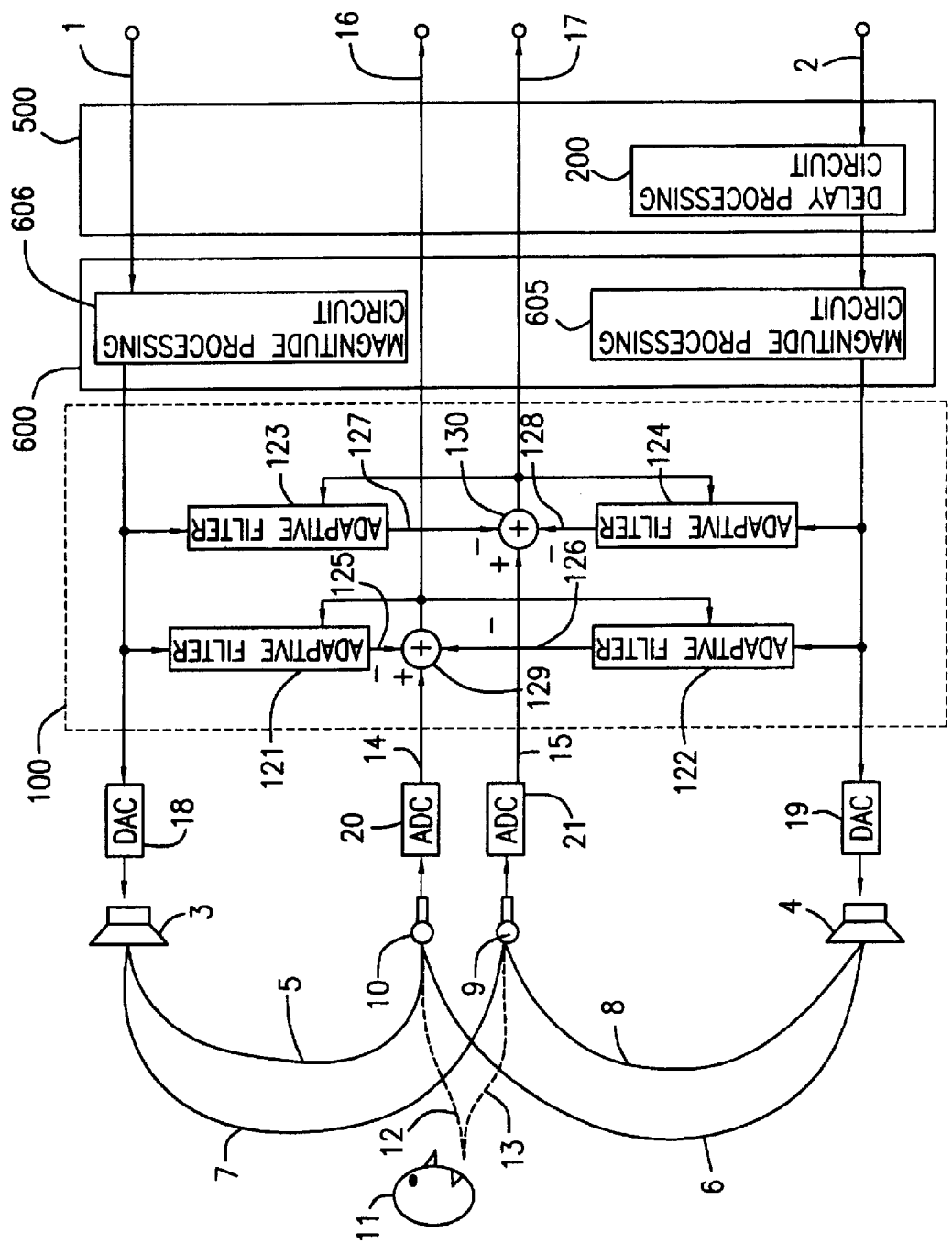
FIG. 13 is a block diagram illustrating a multi-channel echo canceller according to a second embodiment of the present invention.

FIG. 13 shows a multi-channel echo canceller with two channels for the received signals and two channels for the transmission signals, according to the second embodiment of the present invention. The second embodiment differs from the first embodiment of FIG. 1 in that the pre-processing circuit 500 and the non-linear process circuit 600 are exchanged in the order. As described earlier, the pre-processing and the non-linear processing are independently applied. Hence, the configuration in which the order of these processings is exchanged can provide similar effects.

Figure 14:
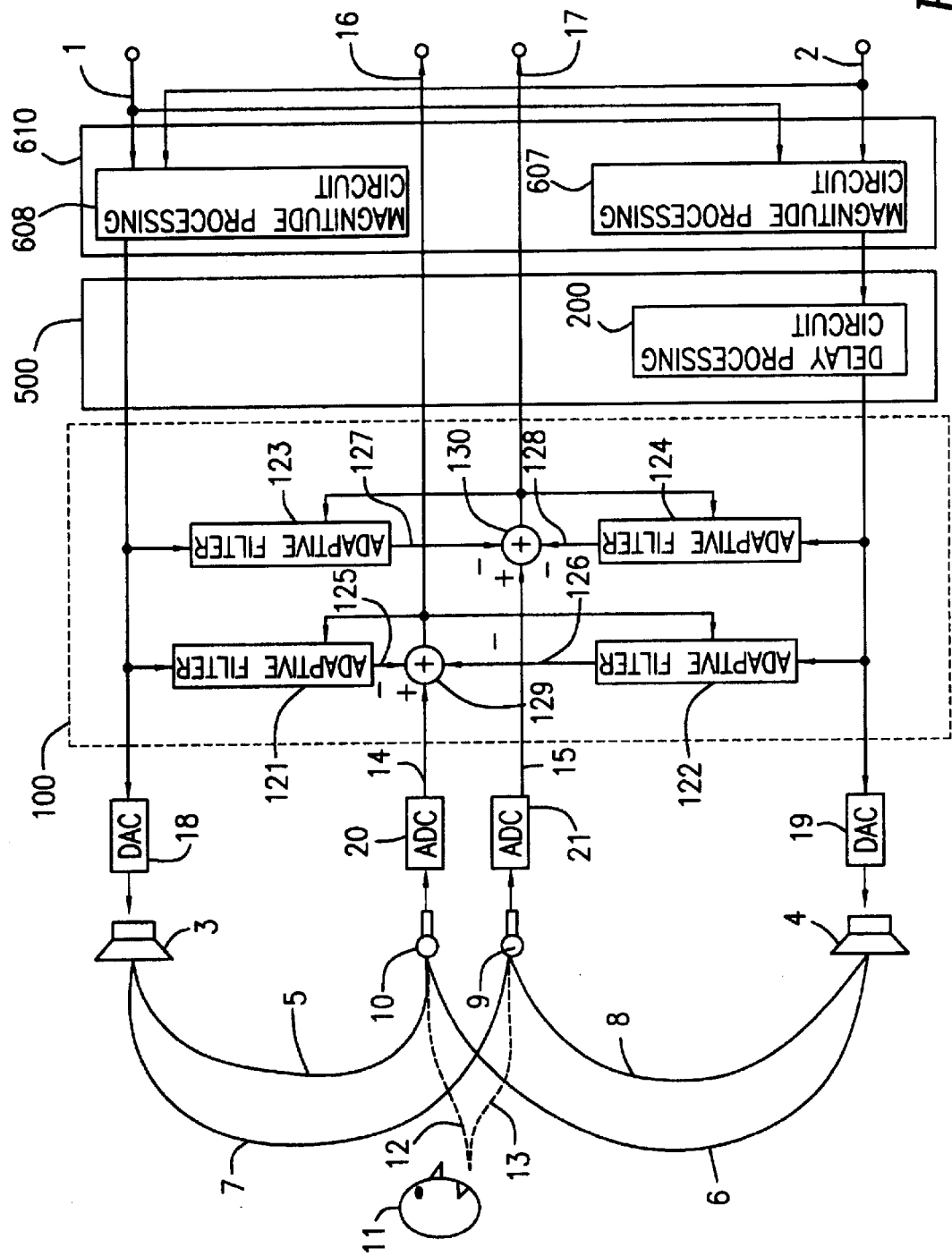
FIG. 14 is a block diagram illustrating a multi-channel echo canceller according to a third embodiment of the present invention.

FIG. 14 shows a multi-channel echo canceller with two channels for the received signals and two channels for the transmission signals, according to the third embodiment of the present invention. The third embodiment differs from the first embodiment of FIG. 1 in that the non-linear processing circuit 610 is substituted with the non-linear processing circuit 600. The non-linear processing circuit 610 includes the magnitude processing circuits 607 and 608 each having the same configuration. Hence, the difference between the non-linear processing circuits 600 and 601 is the difference between magnitude processing circuits 605 and 607.

Figure 15:
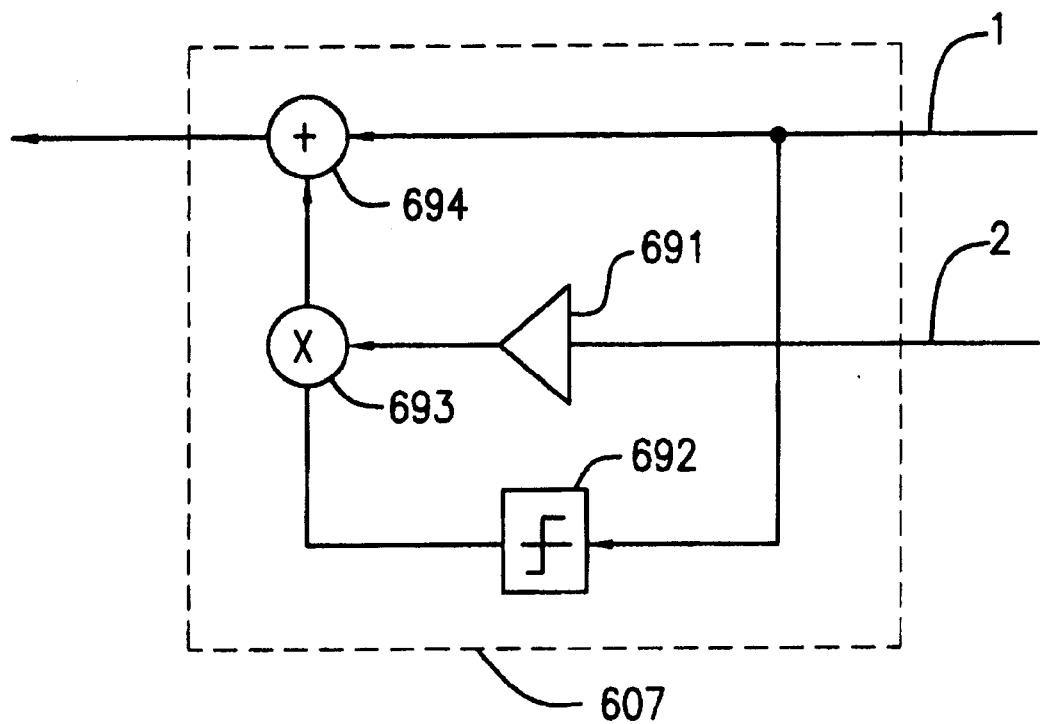
FIG. 15 is a block diagram illustrating the configuration of the magnitude processing circuit 607 or 608.

FIG. 15 is a block diagram illustrating the configuration of the magnitude processing circuit 607 or 608. This configuration differs from that of the magnitude processing circuit 605 or 606 of FIG. 2 in that the coefficient multiplier 691 receives the received signal 2 instead of the received signal 1. The adder 694 produces $(x_1(n)+\alpha x_2(n))$ for the n-th sample of the received signal when the polarity of the n-th received signal sample $x_1(n)$ is positive and produces $x_1(n)$ when the polarity of the n-th received signal sample $x_1(n)$ is negative. The produced signal becomes the output signal of the magnitude processing circuit 608. Similarly, the magnitude processing circuit 607 produces $(x_2(n)+\alpha x_1(n))$ when the polarity of the input signal is positive and produces $x_2(n)$ when the polarity of the input signal is negative. In this embodiment, since the other channel is used for non-linear processing, the variation from the original signal becomes large. Hence, reduction of the correlation between the channels can be large.

Figure 16:
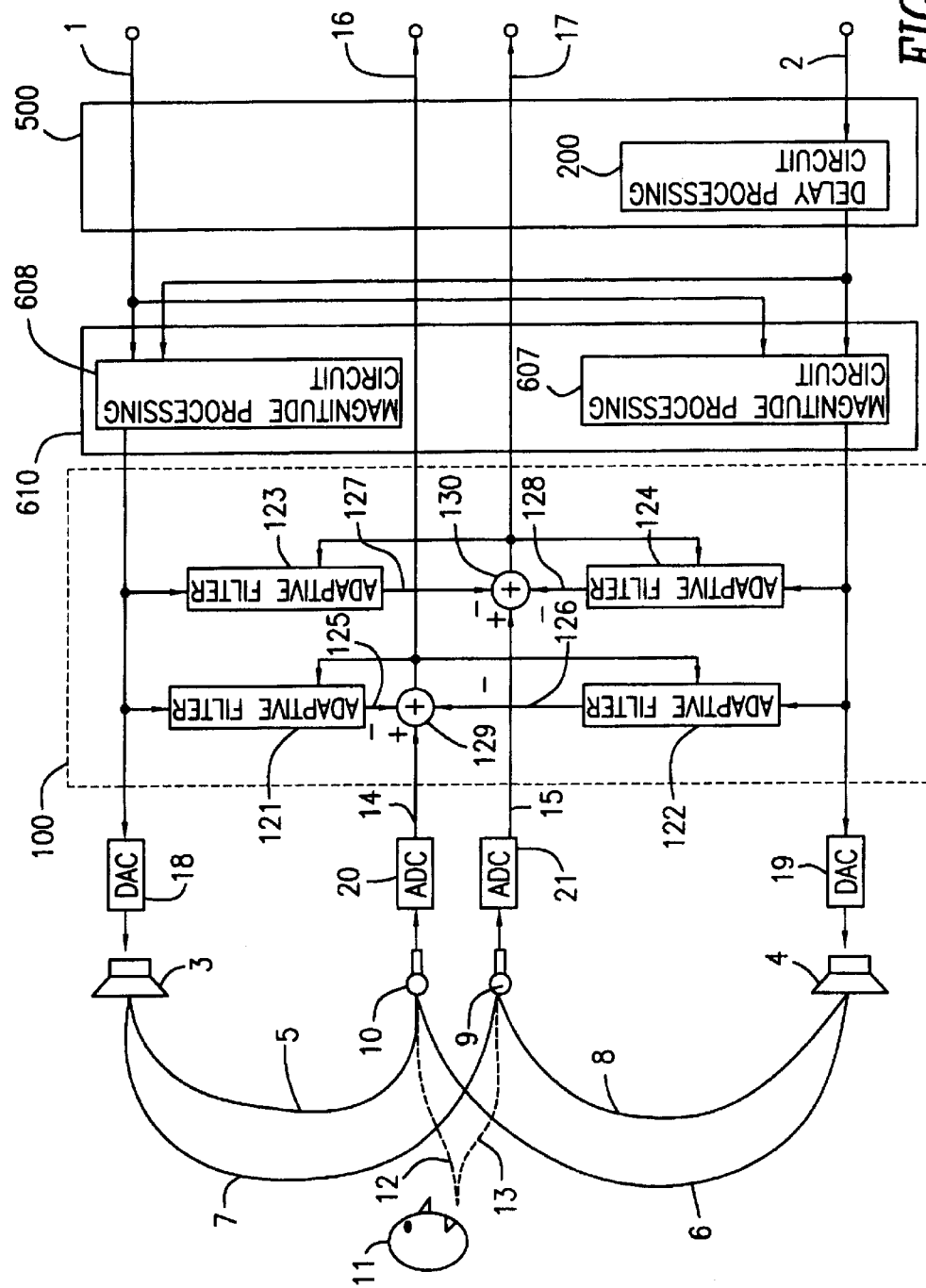
FIG. 16 is a block diagram illustrating a multi-channel echo canceller according to a fourth embodiment of the present invention.

FIG. 16 shows a multi-channel echo canceller with two channels for the received signals and two channels for the transmission signals according to the fourth embodiment of the present invention. Like the first embodiment of FIG. 1 and the second embodiment of FIG. 13, the pre-processing circuit 500 and the non-linear processing circuit 610 are exchanged in the order in the third embodiment of FIG. 14. Because of the same reason as that in the second embodiment, the fourth embodiment has effects identical to those by the third embodiment of FIG. 14.

Next, a case where a new pre-processing circuit is used, wherein the delay processing circuit is applicable to the received signal 2 to create a delayed signal and the magnitude compensating circuit is applicable to the received signal 1, will be described below.

Figure 17:
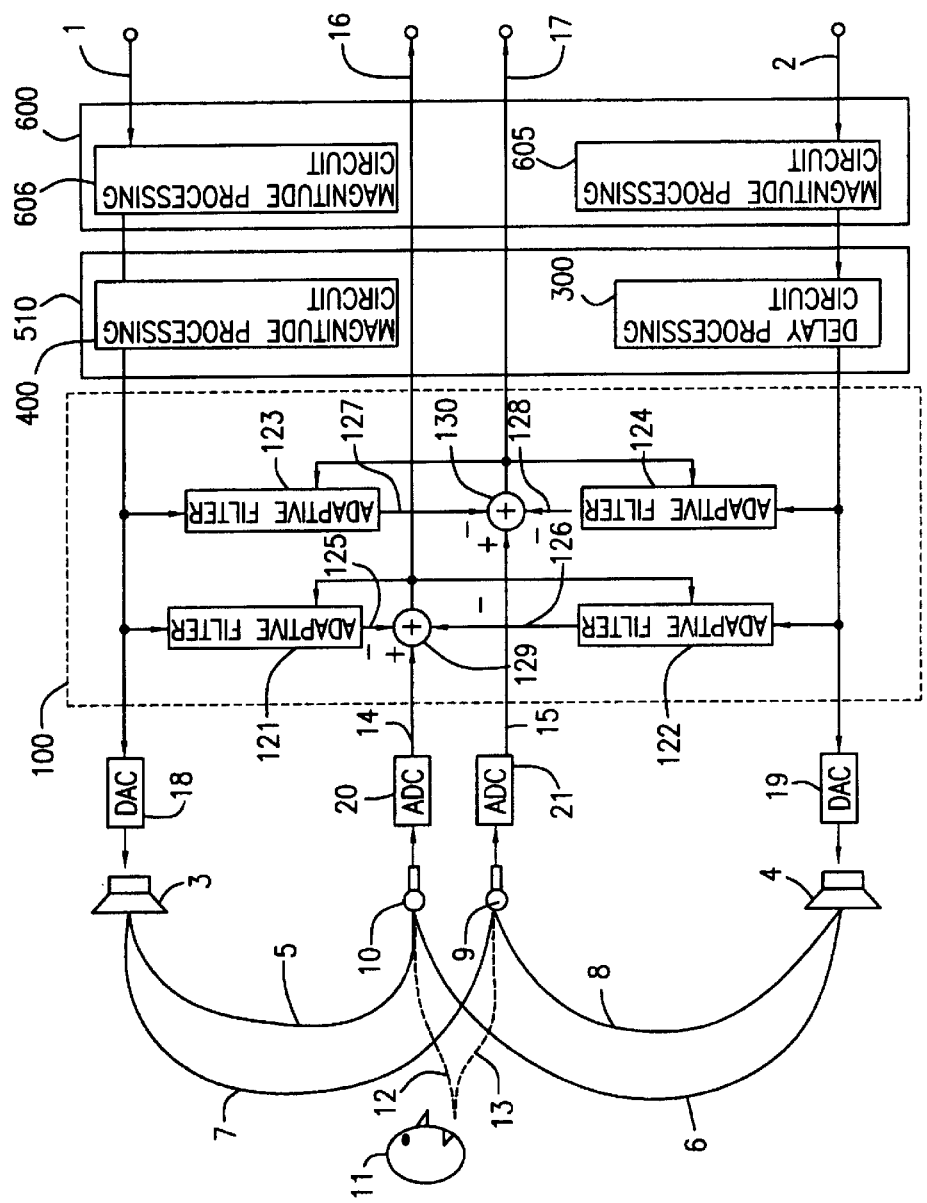
FIG. 17 is a block diagram illustrating a multi-channel echo canceller according to a fifth embodiment of the present invention.

FIG. 17 shows a multi-channel echo canceller with two channels for the received signals and two channels for the transmission signals according to the fifth embodiment of the present invention. Unlike the first embodiment of FIG. 1, the delay processing circuit 300 delays the received signal 2 for the adaptive filters 122 and 124 and the magnitude compensating circuit 400 compensates the amplitude of the received signal 1 for the adaptive filters 121 and 123. Like the delay processing circuit 200, the delay processing circuit 300 processes the output signal of the magnitude processing circuit 605 to converge the coefficients to correct values. The magnitude compensating circuit 400 corrects the magnitude of the output signal of the magnitude processing circuit 606 to compensate the shift of the acoustic image in the acoustic space caused by the delay processing of the delay processing circuit 300. The delay processing circuit 300 corrects the magnitude of the output signal of the magnitude processing circuit 605 whenever the magnitude compensating circuit 400 performs magnitude correction. Likewise, the delay processing circuit 200, the delay processing circuit 300 and the magnitude compensating circuit 400 can be constructed in the configuration shown in FIG. 3, 6, 9, 10, 12 or 13. When the configuration of FIG. 3, 6 or 9 is used, the filter 213 is modified from that of FIG. 4. When the configuration of FIG. 9, 12 or 13 is used, the filter 230 is modified from that of FIG. 4.

Figure 18:
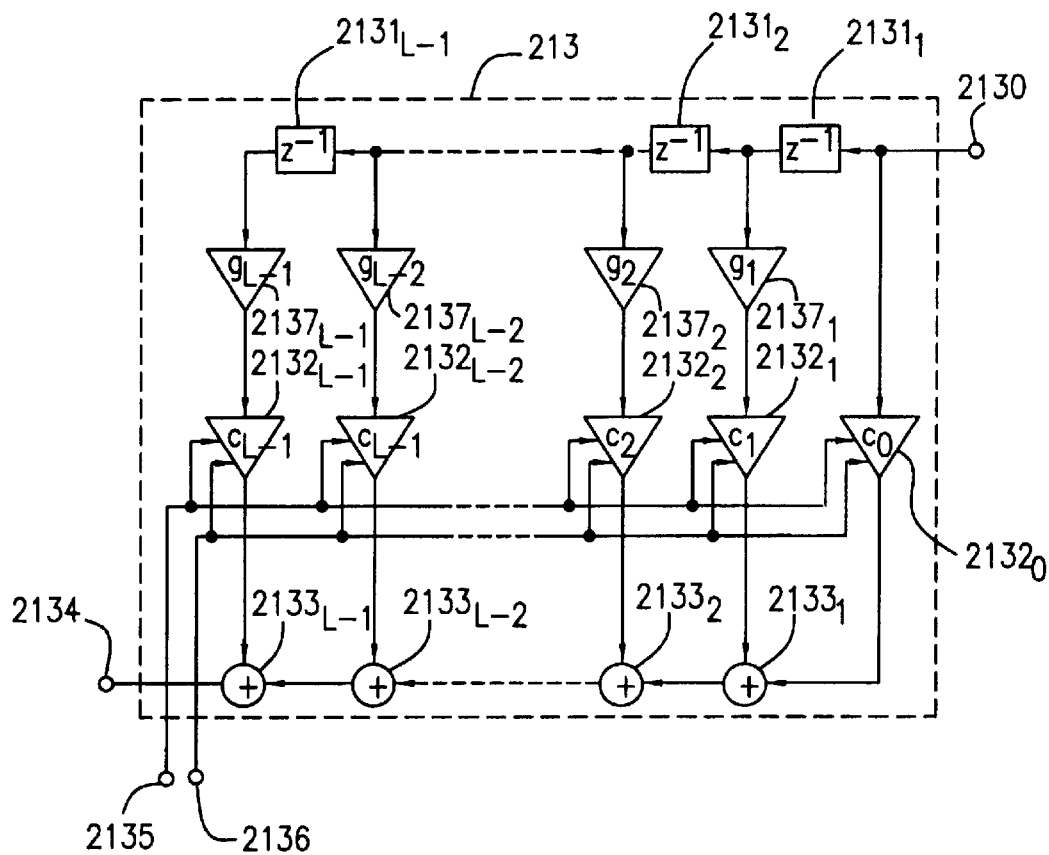
FIG. 18 is a block diagram illustrating the configuration of the filter 213 or 230 in the delay processing circuit 300.

FIG. 18 is a block diagram illustrating the configuration of the filter 213 containing the delay processing circuit 300 with the configuration of FIG. 3, 6 or 9 and the configuration of the filter 230 containing the delay processing circuit 300 with the configuration of FIG. 9, 12 or 13. Here, it is assumed that the filter is an L-tap FIR filter. However, the filter may be in another type such as an IIR filter. Unlike the configuration of FIG. 4, the coefficient multipliers $g_1, g_2, \ldots, g_{L-1}$ are inserted in cascade to the coefficient multipliers $c_0, c_1, C_2, \ldots, c_{L-1}$, (except $c_0$). This means that the coefficient multipliers $c_0, g_1 c_1, \ldots, g_{L-1} c_{L-1}$ are equivalently substituted for the coefficient multipliers $c_0, c_1, c_2, \ldots, C_{L-1}$ of FIG. 4. The operation of the circuit of FIG. 18 is equal to that of the circuit of FIG. 4. Hence, it is apparent that the use of the filters of FIG. 4 allow the coefficient values $c_0, c_2, \ldots, c_{L-1}$ of the coefficient multipliers $2132_1, 2132_2, \ldots, 2132_{L-1}$ to be replaced with the coefficient values $g_1, c_1, \ldots, g_{L-1} c_{L-1}$.

Figure 19:
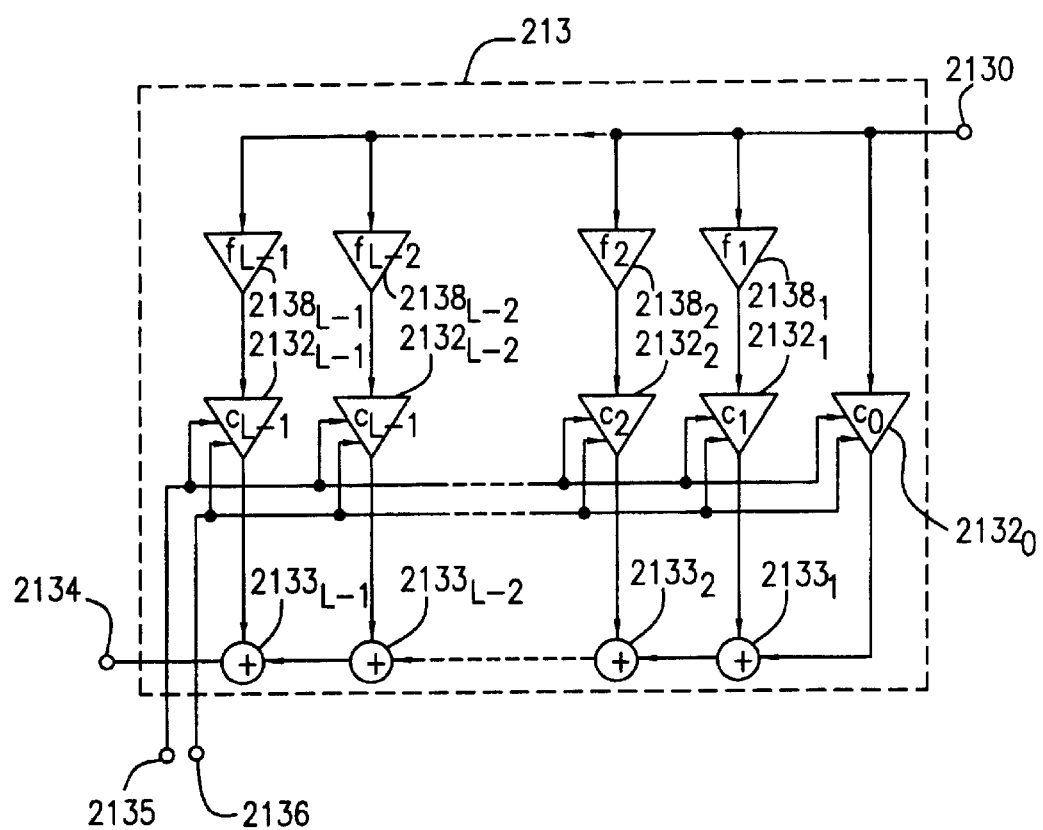
FIG. 19 is a block diagram illustrating the first configuration of the filter 213 or 230 in the magnitude compensating circuit 400.

FIG. 19 is a block diagram illustrating the configuration of the filter 213 having the magnitude compensating circuit 400 with the configuration of FIG. 3, 6 or 9 as well as the configuration of the filter 230 having the magnitude compensating circuit 400 with the configuration of FIG. 9, 12 or 13. Here, it is assumed that the filter is an L-tap FIR filter. However, the filter may be in another type such as an IIR filter. Unlike the configuration of FIG. 18, the delay elements $2132_1, 2132_2, \ldots, 2132_{L-1}$ are not used.

The filters shown in FIGS. 18 and 19 operate complimentarily. That is, the shift of an acoustic image is corrected by a group of coefficient multipliers $2137i$ (i=1, 2, ..., L−1) or a group of coefficient multipliers $2138_i$ (i=1, 2, ..., L−1). The two groups correspond to each other. The principle of correcting a shift of the acoustic image caused by delay variations by magnitude correction is disclosed in "Medical Research Council Special Report", No. 166, 1932, pp. 1–32 (reference 11) and "Journal of Acoustical Society of America", Vol. 32, 1960, pp. 685–692 (reference 12) and "Journal of Acoustical Society of America", Vol. 94, 1993, pp. 98–110 (reference 13). In the example of FIG. 13, since the output of the delay processing circuit 200 is delayed, the acoustic images of acoustic signals reproduced for the talker 11 by the loudspeakers 3 and 4 move toward the loudspeaker 3. In order to compensate for the shift, the magnitudes of the signal radiated from the loudspeaker 4 in the acoustic space is increased while the magnitudes of the signal radiated from the loudspeaker 3 in the acoustic space is decreased.

According to the reference 13, in order to move the acoustic image by magnitude correction, with the total power of the received signals 1 and 2 maintained constant, the following equation must be held between the power $P_1$ (dB) and the power $P_2$ (dB), the powers of these signals.

$$P_1 + P_2 = C \tag{11}$$

where C is a positive constant.

For the power of the received signal 1 and the power of the received signal 2 which are $P_1$ bar dB and $P_2$ bar dB respectively before the magnitude correction, the following equations must be satisfied:

$$P_1 = \bar{P}_1 - \Delta P/2 \tag{12}$$

$$P_2 = \bar{P}_2 + \Delta P/2 \tag{13}$$

where $\Delta P/2$ is a power correction value. For that reason, the coefficients $g_i$ and $f_1$ of the multipliers for correction corresponding to the filters shown in FIGS. 18 and 19 can be determined by the equations (14) and (15).

$$f_i = 10^{\frac{-\Delta P_i}{40}} \tag{14}$$

$$g_i = 10^{\frac{\Delta P_i}{40}} \tag{15}$$

where $\Delta P_i$ is a power compensation coefficient required to compensate the received signal delayed by i samples.

Figure 20:
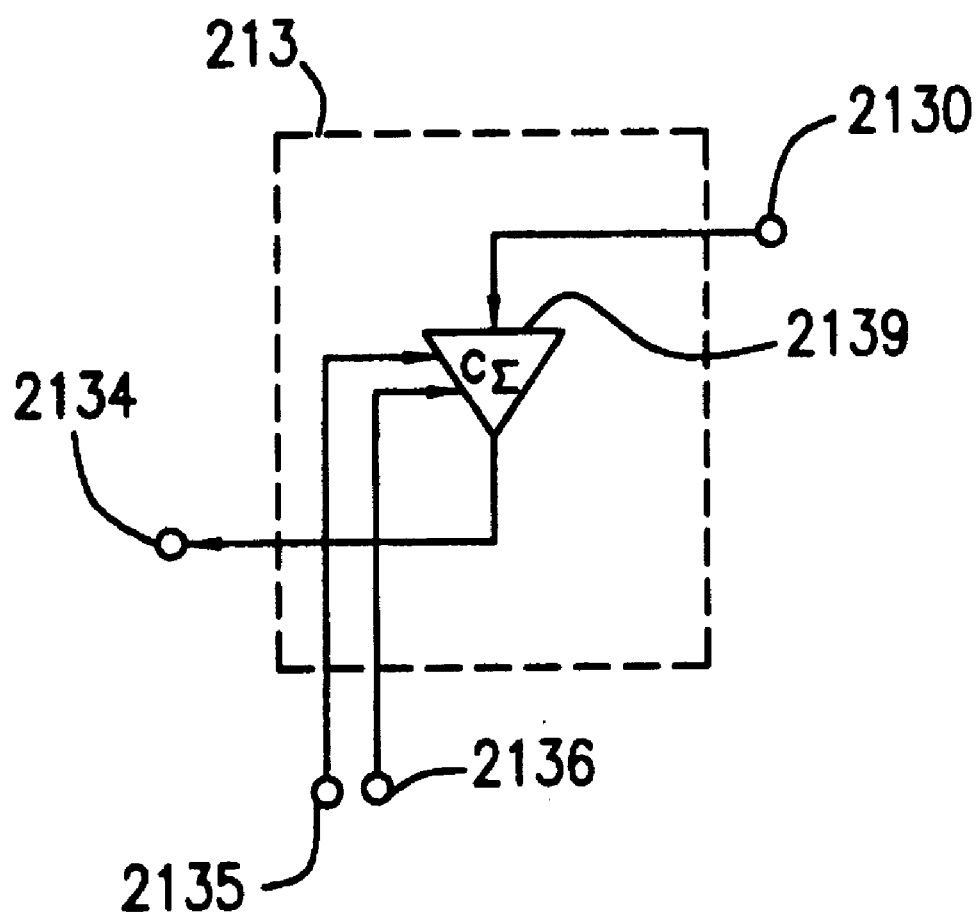
FIG. 20 is a block diagram illustrating the second configuration of the filter 213 or 230 in the magnitude compensating circuit 400.

FIG. 20 illustrates another configuration of the filter of FIG. 19. In FIG. 19, a plurality of coefficient multiplier groups, each having coefficient multipliers serially connected, are connected in parallel. Referring to FIG. 20, the multiplier groups are integrated into one coefficient multiplier unit. The input signal is input to the input terminal 2130.

The multiplier 2139 with a time varying coefficient $c_\Sigma$ multiplies the input signal by $c_\Sigma$. The resultant product is output via the output terminal 2134.

$c_\Sigma$ is expressed by the following equation.

$$c_\Sigma = c_0 + \sum_{i=1}^{L-1} f_i c_i \tag{16}$$

The delay processing circuit 300 applied to the received signal 2 and the magnitude compensating circuit 400 applied to the received signal 1 have been described by referring to FIGS. 13, and 18 to 20. However, a similar description can be apparently applied to the delay processing circuit 300 used for the received signal 1 and the magnitude compensating circuit 400 used for the received signal 2.

Figure 21:
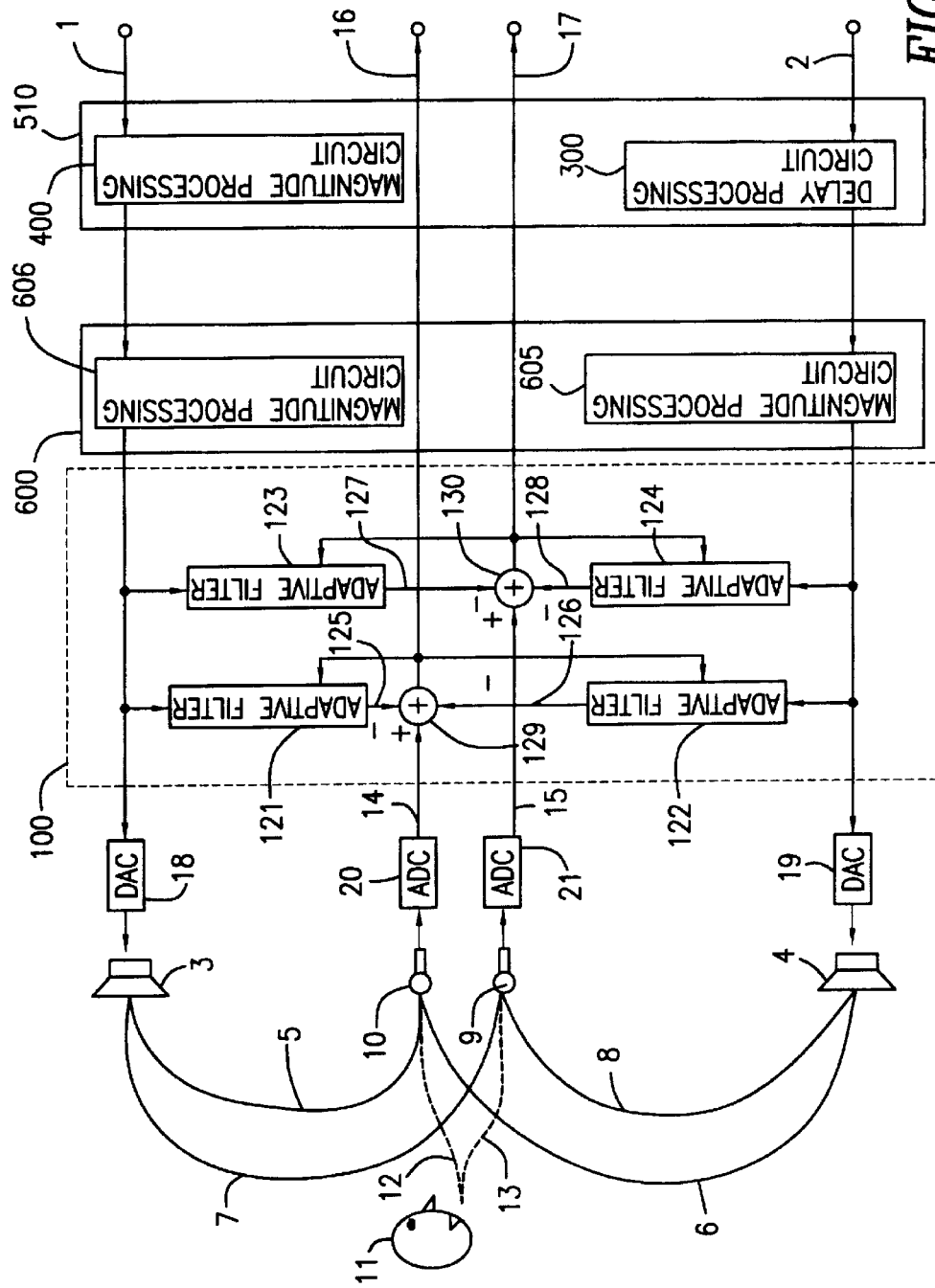
FIG. 21 is a block diagram illustrating a multi-channel echo canceller according to a sixth embodiment of the present invention.

FIG. 21 depicts a multi-channel echo canceller with two channels for the received signals and two channels for the transmission signals, according to the sixth embodiment of the present invention. Like the relationship between FIGS. 1 and 13, FIG. 21 shows the configuration where the preprocessing circuit 510 and the non-linear processing circuit 600 in FIG. 17 are exchanged in the order.

Figure 22:
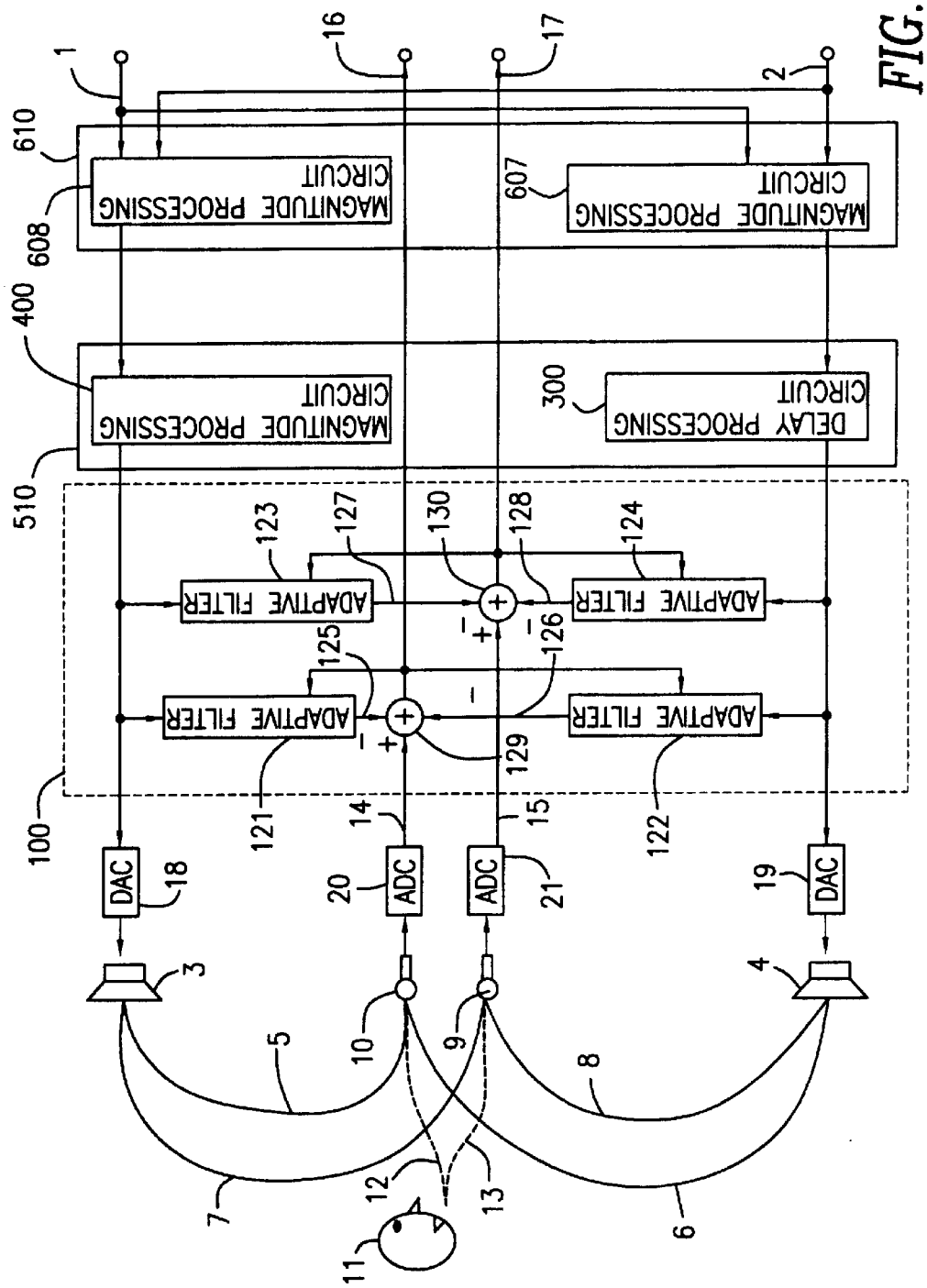
FIG. 22 is a block diagram illustrating a multi-channel echo canceller according to a seventh embodiment of the present invention.

FIG. 22 depicts a multi-channel echo canceller with two channels for the received signals and two channels for the transmission signals, according to the seventh embodiment of the present invention. FIG. 22 shows the configuration where the non-linear processing circuit 610 is substituted for the non-linear processing circuit 600 in FIG. 17. The effect is apparent from the relationship between the configuration of FIG. 1 and the configuration of FIG. 14.

Figure 23:
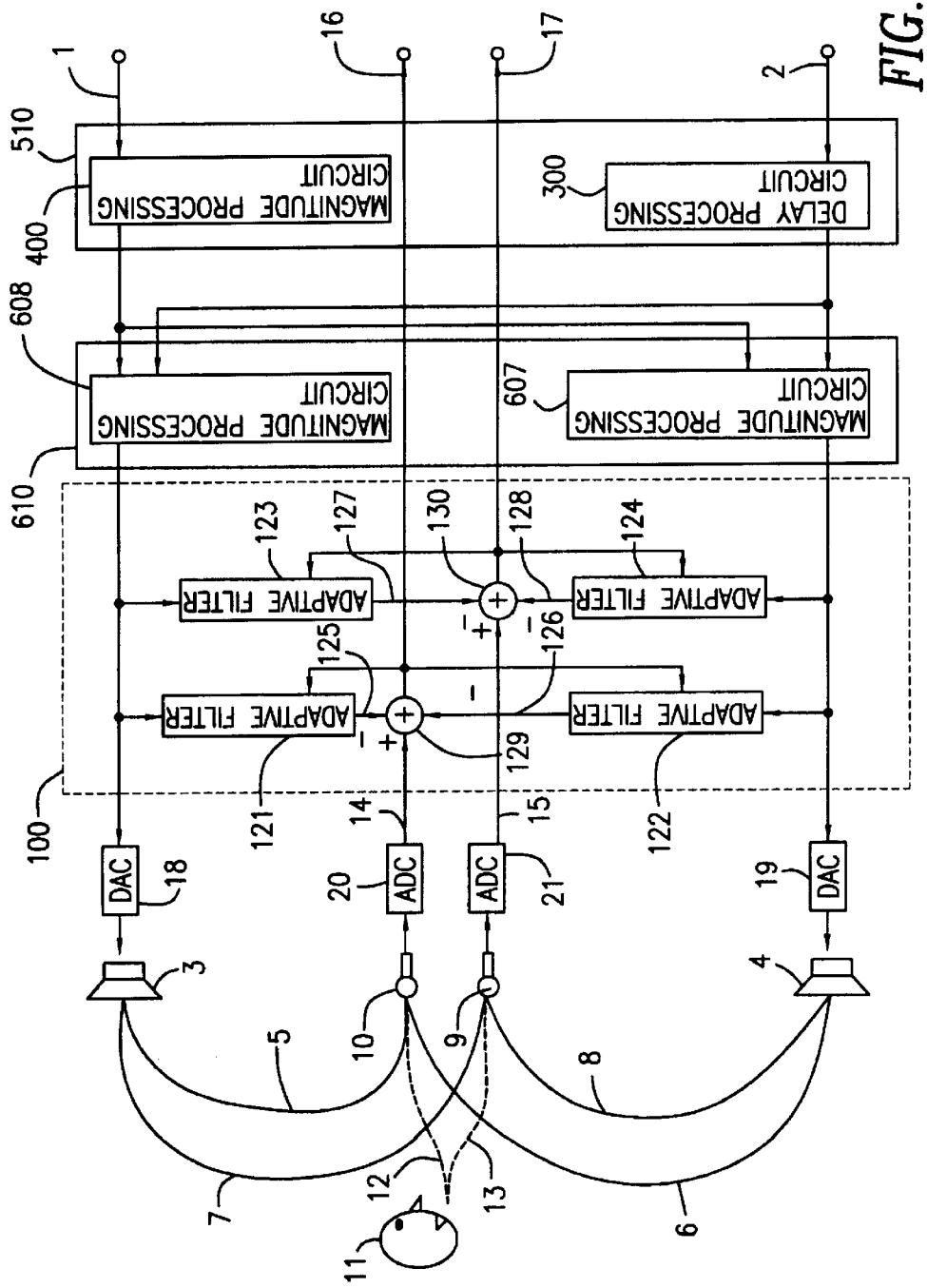
FIG. 23 is a block diagram illustrating a multi-channel echo canceller according to an eighth embodiment of the present invention.

FIG. 23 depicts a multi-channel echo canceller with two channels for the received signals and two channels for the transmission signals, according to the eighth embodiment of the present invention. FIG. 23 shows the configuration where the non-linear processing circuit 610 and the preprocessing circuit 510 in FIG. 22 are exchanged in the order. The effect is apparent from the relationship between the configuration of FIG. 14 and the configuration of FIG. 16.

Figure 24:
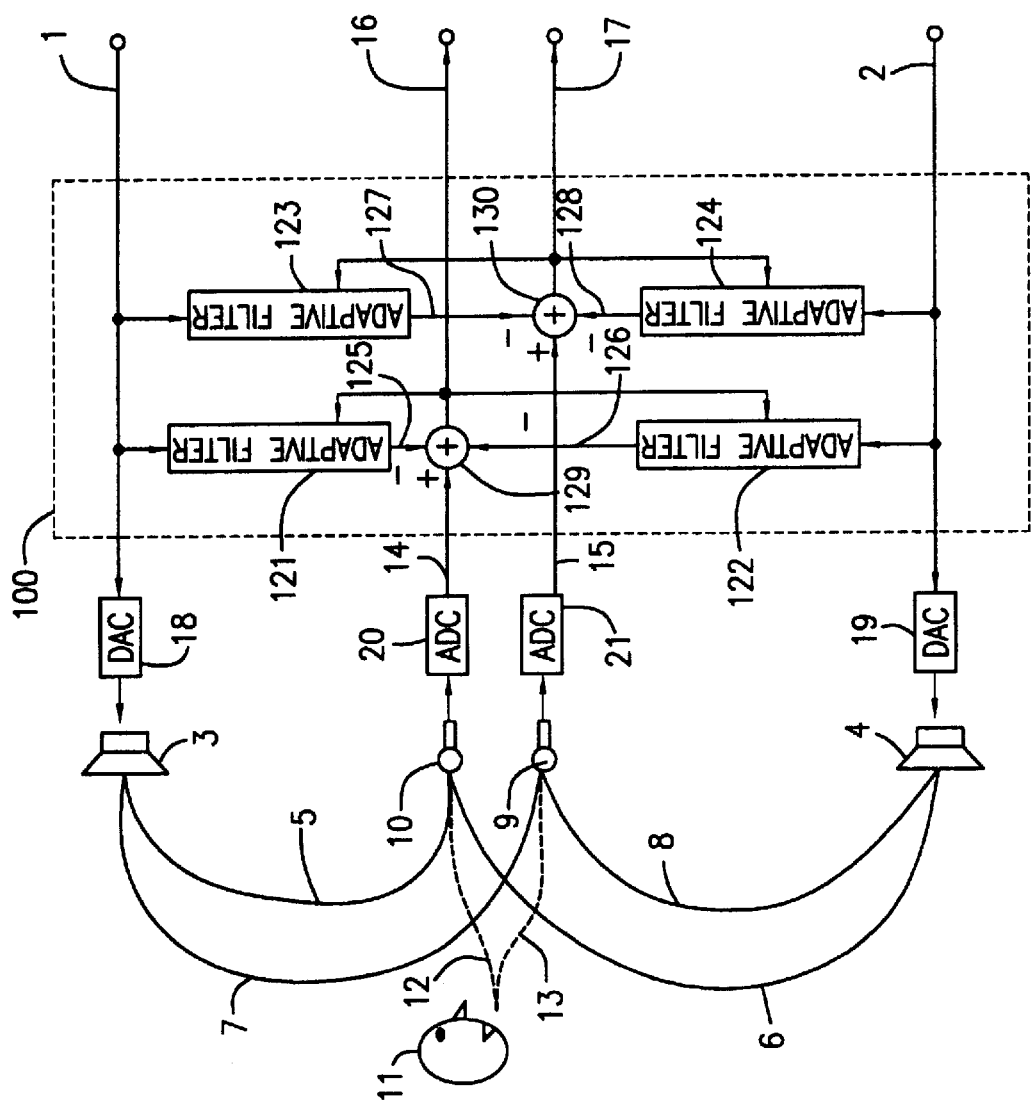
FIG. 24 is a block diagram illustrating a multi-channel echo canceller based on Linear Combination.

According to the above-mentioned embodiments, echo cancellation for multi-channel teleconferencing systems has been discussed. However, a similar discussion can be applied to single-channel, multi-point teleconferencing systems being another application of multi-channel echo cancellation. In the single-channel, multi-point teleconferencing system, an attenuation and a delay are suitably added to the voice of a talker received by a single microphone such that the talker is localized at a desired position between the loudspeakers used on the receiver side. A plurality of such signals corresponding to the number of loudspeakers on the receiving side are created. When the number of loudspeakers on the receiving side is 2, the two signals, to which the attenuation process and the delay processing in the prior-art configuration shown in FIG. 24 are applied, respectively, correspond to the received signal 1 and the received signal 2. Hence, the embodiments of the present invention can be applied without any change.

Here, an example where the received signal 1 and the received signal 2, the first mixed signal 14 and the second mixed signal 15 are used has been described. However, the present invention is applicable to the case where plural received signals and a single or plural transmission signals are used. In the examples, the received signal propagates from loudspeakers to a microphone via spatial acoustic paths and the acoustic echo received by the microphone is removed. However, the present invention is applicable to cancel echoes other than acoustic echoes, for example, echoes such as crosstalk. Moreover, examples where finite impulse response filters based on the LMS algorithm are used as the adaptive filters 121, 122, 123 and 124 have been described. However, the present invention can use an arbitrary type of adaptive filters. For example, when the finite impulse response filters based on the NLMS algorithm are used, the filter coefficient updates are expressed by:

$$w_{1,i}(n+1) = w_{1,i}(n) + \mu \frac{e_1(n)x_1(n-i)}{\sum_{i=0}^{N-1} x_1^2(n-i)} \tag{17}$$

$$w_{2,i}(n+1) = w_{2,i}(n) + \mu \frac{e_2(n)x_2(n-i)}{\sum_{i=0}^{N-1} x_2^2(n-i)} \tag{18}$$

The sequential regression algorithm (SRA) (reference 8) and the RLS algorithm (reference 9) may also be used as the algorithm for adaptive filters. Infinite impulse response (IIR) adaptive filters may be used instead of the finite impulse response (FIR) adaptive filters. Moreover, the subband adaptive filters or transform-domain adaptive filters may be used.

In the multi-channel echo canceling system according to the present invention, one received signal is filtered to create a supplement signal. Then, the adaptive filters are operated using a new received signal obtained by time-multiplexing the supplement signal with the original received signal. The adaptive filter operates in response to a signal obtained by multiplexing the original received signal with a new supplement signal. Thus, plural adaptive filters are not used to estimate echoes caused by signals propagating from one signal source via plural paths. Consequently, the number of conditional equations for adaptive filter coefficients and the problem does not occur that the solution becomes indefinite. This is because the conventional multi-channel echo canceller based on linear combination can use only the three conditionals in (7). However, the present invention can use six conditionals, that is twice the number in the prior art, so that the adaptive filter coefficients converge to optimum values which are uniquely determined.

Moreover, according to the present invention, the multiplex parameter for the original received signal and the supplement signal is controlled based on the nature of the received signal. Meanwhile, the sound shift caused by the introduction of the supplement signal is canceled by correcting the magnitude of the input signals. Thus, the degradation in sound quality of the audible received signal directly supplied to the loudspeaker is suppressed, so that good sound quality can be maintained. Moreover, the convergence time can be shortened by a synergistic effect regarding the non-linear processing and reduction in correlation between the received signals due to the introduction of the supplement signal.

The entire disclosure of Japanese Patent Application No. 10-248025 filed on Sep. 2, 1998 including specification, claims, drawing and summary are incorporated herein by reference in its entirety.

What is claimed is:

1. A multi-channel echo canceling apparatus suitable in a system having a plurality of received signals and a single or plural transmission signals, wherein echoes are removed by subtracting replicas from mixed signals containing a plurality of echoes and said transmission signals, said echoes being caused by said plurality of received signals propagating in a spatial acoustic paths or caused by crosstalks on transmission lines, said replicas corresponding to said plurality of echoes created by plural adaptive filters which receives said plurality of received signals, comprising:

a plurality of adaptive filters each respectively corresponding to said spatial acoustic path or to said crosstalk path between channels, said adaptive filters creating said replicas in response to the same received signal as the signal supplied to a corresponding path;

a non-linear processing circuit for implementing a non-linear process for said plurality of received signals to generate a plurality of non-linear received signals;

a pre-processing circuit for filtering one of said plurality of non-linear received signals to generate a processed signal, time-multiplexing said processed signal and said selected non-linear received signal to be filtered, and then supplying the multiplexed signal as the new received signal to said plurality of adaptive filters and a plurality of subtracters for subtracting said created replicas from said mixed signals;

whereby said plurality of filters are controlled to minimize the outputs of said plurality of subtracters.

2. A multi-channel echo canceling apparatus suitable in a system having a plurality of received signals and a single or plural transmission signals, wherein echoes are removed by subtracting replicas from mixed signals containing a plurality of echoes and said transmission signals, said echoes being caused by said plurality of received signals propagating in spatial acoustic paths or caused by crosstalks on transmission lines, said replicas corresponding to said plurality of echoes created by plural adaptive filters which receives said plurality of received signals, comprising at least:

a plurality of adaptive filters each respectively corresponding to said spatial acoustic path or to said crosstalk path between channels, said adaptive filters creating said replicas in response to the same received signal as the signal supplied to a corresponding path;

a pre-processing circuit for filtering one of said plurality of received signals to produce a processed signal and then time-multiplexing said processed signal and the received signal to be filtered;

a non-linear processing circuit for non-linearly processing the output from said pre-processing circuit and then supplying the non-linearly processed signals as a new received signal to plural adaptive filters; and a plurality of subtracters for subtracting said created replicas from said mixed signal;

whereby said plurality of filters are controlled to minimize the outputs of said plurality of subtracters.

3. An echo cancelling method for a multi-channel communication system connecting a first and a second station, said method comprising:

non-linearly processing signals received at said first station from said second station;

filtering a selected one of said non-linearly processed signals to produce a filtered signal;

time-multiplexing said selected non-linearly processed signal and said filtered signal to produce a multiplexed signal;

processing said multiplexed signal through a first plurality of adaptive filters to produce a first plurality of echo replica signals;

processing each of said non-linearly processed signals except said selected non-linearly processed signal through a second plurality of adaptive filters to produce a second plurality of echo replica signals; and subtracting selected ones of said first and second plurality of echo replica signals from signals being transmitted from said first station to said second station such that an echo replica signal derived from said multiplexed signal, and from each of said non-linearly processed signals except said selected non-linearly processed signal is subtracted from each transmitted signal.

4. The method defined in claim 3, wherein said non-linear processing step comprises, for each received signal being non-linearly processed, the steps of:

multiplying a different received signal by a coefficient that varies according to the polarity of said one received signal, and adding the product to said one received signal.

5. The method defined in claim 3, wherein said multiplexing step comprises alternatively outputting said selected non-linearly processed signal and said filtered signal.

6. The method defined in claim 3, further comprising the step of filtering said selected non-linearly processed signal using plural time-varying coefficients with values of zero and values of non-zero, whereby said selected non-linearly processed signal and said filtered signal are time-multiplexed.

7. The method defined in claim 3, wherein said selected non-linearly processed signal and said filtered signal are time-multiplexed at a sampling frequency that is lower than sampling frequencies associated with the signals being multiplexed.

8. The method defined in claim 3, further including the step of:
analyzing the selected non-linearly processed signal to identify a predetermined property thereof, and wherein:
the selected non-linearly processed signal and the filtered signal are time-multiplexed at a sampling frequency that is lower than sampling frequencies associated with the signals being multiplexed, and varies depending on the result of the analysis step.

9. An echo canceling method for a multi-channel communication connecting a first and a second station, said method comprising the steps of:
selecting one of a plurality of incoming signals received at said first station from said second station;
filtering said selected received signal to produce a filtered signal;
time-multiplexing said selected received signal with said filtered signal to produce a multiplexed signal;
non-linearly processing said multiplexed signal and each of said received signals other than said selected received signal to produce non-linearly processed signals;
processing said non-linearly processed signals through separate adaptive filters to create a plurality of echo replica signals; and
subtracting selected ones of said echo replica signals from signals being transmitted from said first station to said second station such that an echo replica signal derived from each of said non-linearly processed signals is subtracted from each transmitted signal.

10. The method defined in claim 9, wherein said non-linear processing step comprises, for each incoming signal and filtered signal being non-linearly processed, the steps of:
multiplying a different signal by a coefficient that varies according to the polarity of said signal being non-linearly processed; and
adding the product to said signal being non-linearly processed.

11. The method defined in claim 9, wherein said multiplexing step comprises alternatively outputting said selected incoming signal and said filtered signal.

12. The method defined in claim 9, further comprising the step of filtering said selected incoming signal using plural time-varying coefficients with values of zero and values of non-zero, whereby said selected incoming signal and said filtered signal are time-multiplexed.

13. The method defined in claim 9, wherein said selected incoming signal and said filtered signal are time-multiplexed at a sampling frequency that is lower than sampling frequencies associated with the signals being multiplexed.

14. The method defined in claim 9, further including the step of:
analyzing the selected incoming signal to identify a predetermined property thereof, and wherein:
the selected incoming signal and the filtered signal are time-multiplexed at a sampling frequency that is lower than sampling frequencies associated with the signals being multiplexed, and varies depending on the result of the analysis step.

15. An echo canceling method for a multi-channel communication connecting a first and a second station, said method comprising the steps of:
selecting one of a plurality of incoming signals received at said first station from said second station;
non-linearly processing said selected incoming signal to produce a first non-linear signal;
filtering said first non-linear signal to produce a filtered signal;
time-multiplexing said first non-linear signal with said filtered signal to produce a multiplexed signal;
adjusting the magnitude of said time multiplexed signal;
processing said magnitude-adjusted multiplexed signal through a first plurality of adaptive filters to create a first plurality of echo replica signals;
non-linearly processing said incoming signals other than said selected signal to produce a plurality of additional non-linear signals;
adjusting the magnitude of said additional non-linear signals;
processing said magnitude-adjusted additional non-linear signals through a second plurality of adaptive filters to create a second plurality of echo replica signals;
subtracting selected ones of said echo replica signals from signals being transmitted from said first station to said second station such that an echo replica signal derived from said multiplexed signal, and from each of said plurality of additional non-linear signals is subtracted from each transmitted signal.

16. The method defined in claim 15, wherein said non-linear processing step comprises, for one incoming signal being non-linearly processed, the steps of:
multiplying a different incoming signal by a coefficient that varies according to the polarity of said one incoming signal; and
adding the product to said one incoming signal.

17. The method defined in claim 15, wherein said multiplexing step comprises alternatively outputting said first non-linear signal and said filtered signal.

18. The method defined in claim 15, further comprising the step of filtering said first non-linear signal using plural time-varying coefficients with values of zero and values of non-zero, whereby said first non-linear signal and said filtered signal are time-multiplexed.

19. The method defined in claim 15, wherein said first non-linear signal and said filtered signal are time-multiplexed at a sampling frequency that is lower than sampling frequencies associated with the signals being multiplexed.

20. The method defined in claim 15, further including the step of:
analyzing the first non-linear signal to identify a predetermined property thereof, and wherein:
the first non-linear signal and the filtered signal are time-multiplexed at a sampling frequency that is lower than sampling frequencies associated with the signals being multiplexed, and varies depending on the result of the analysis step.

21. An echo canceling method for a multi-channel communication connecting a first and a second station, said method comprising the steps of:
selecting one of a plurality of incoming signals received at said first station from said second station;
filtering said selected signal to produce a filtered signal;
time-multiplexing said selected signal with said filtered signal to produce a multiplexed signal;
adjusting the magnitude of said multiplexed signal;
non-linearly processing said magnitude-adjusted multiplexed signal to produce a first non-linear signal;
processing said first non-linear signal through a first plurality of adaptive filters to create a first plurality of echo replica signals;

adjusting the magnitude of said incoming signals other than said selected signal to produce a plurality of additional non-linear signals, non-linearly processing said additional non-linear signals;

processing said magnitude-adjusted additional non-linear signals through a second plurality of adaptive filters to create a second plurality of echo replica signals, subtracting selected ones of said echo replica signals from signals being transmitted from said first station to said second station such that an echo replica signal derived from said first non-linear signal, and from each of said additional non-linear signals is subtracted from each transmitted signal.

22. The method defined in claim 21, wherein said non-linear processing step comprises, for said magnitude—adjusted multiplexed signal and said incoming signals being non-linearly processed, the steps of:

multiplying a different signal by a coefficient that varies according to the polarity of said signal being non-linearly processed; and adding the product to said signal being non-linearly processed.

23. The method defined in claim 21, wherein said multiplexing step comprises alternatively outputting said selected incoming signal and said filtered signal.

24. The method defined in claim 21, further comprising the step of filtering said selected incoming signal using plural time-varying coefficients with values of zero and values of non-zero, whereby said selected incoming signal and said filtered signal are time-multiplexed.

25. The method defined in claim 21, wherein said selected incoming signal and said filtered signal are time-multiplexed at a sampling frequency that is lower than sampling frequencies associated with the signals being multiplexed.

26. The method defined in claim 21, further including the step of:

analyzing the selected incoming signal to identify a predetermined property thereof, and wherein:

the selected incoming signal and said filtered signal are time-multiplexed at a sampling frequency that is lower than sampling frequencies associated with the signals being multiplexed, and varies depending on the result of the analysis step.

27. An echo canceling apparatus for a multi-channel communication including a first and a second station, said apparatus comprising:

a non-linear processing circuit connected to receive an incoming signals received at said first station from said second station, and operative to generate a plurality of non-linear signals;

a pre-processing circuit connected to receive one of said non-linear signals, said preprocessing circuit including:
    a filter responsive to said one non-linear signal to generate a filtered signal; and
    a multiplexer connected to receive said filtered signal and said one non-linear signal to provide a multiplexed signal;

a first and a second plurality of adaptive filters each respectively corresponding to an echo source in said communication system,
    said first plurality of adaptive filters being connected to receive said first non-linear output signal as an input thereto, and operative to generate a first plurality of echo replica signals;
    each of said non-linear signals other than said one non-linear signal being provided as an input to at least one of said second plurality of adaptive filters,
    said second plurality of adaptive filters being operative to generate a second plurality of echo replica signals; and a plurality of subtraction circuits operative to subtract selected ones of said echo replica signals from signals being transmitted from said first station to said second station such that an echo replica signal derived from said one non-linear signal, and an echo replica signal derived from each of said non-linear signals other than said one non-linear signal are subtracted from each transmitted signal.

28. The echo canceling apparatus defined in claim 27, wherein said non-linear processing circuit comprises a plurality of magnitude processing circuits, each of said magnitude processing circuits including:

a polarity detection circuit responsive to the polarity of one of said incoming signals from said second station;

a coefficient multiplier for multiplying a different one of said incoming signals by a constant;

a multiplier operative to multiply the output of said polarity detection circuit by the output of said coefficient multiplier; and an adder operator add the output of said multiplier and the one incoming signal, whereby, for one polarity of said selected incoming signal, said non-linear processing circuit adds said different incoming signal multiplied by a constant to said one incoming signal and outputs the resulting sum, and for the opposite polarity of the selected incoming signal, outputs only said one incoming signal.

29. The echo canceling apparatus defined in claim 27, wherein said multiplexer comprises a switch having inputs provided by said one non-linear signal and said filtered signal, said switch being operative in response to a control signal to alternately output the inputs thereto.

30. The echo canceling apparatus defined in claim 29, wherein said pre-processing circuit further comprises:

a frequency divider responsive to a reference clock signal to generate said control signal, said control signal having a frequency less than sampling frequencies associated with the signals to be multiplexed; and wherein said filter is a variable coefficient filter responsive to said reference clock signal and said control signal.

31. The echo canceling apparatus defined in claim 29, wherein said pre-processing circuit further comprises:

a frequency divider responsive to a reference clock signal to generate said control signal, said control signal having a frequency less than sampling frequencies associated with the signals to be multiplexed;

an analysis circuit responsive to a predetermined characteristic of said one non-linear signal to generate an output signal; and an AND circuit responsive to coincidence of the control signal and the output of said analysis circuit; and wherein said filter is a variable coefficient filter responsive to said reference clock signal and the output of said AND circuit.

32. The echo canceling apparatus defined in claim 29, wherein said pre-processing circuit further comprises:

an analysis circuit responsive to a predetermined characteristic of said one non-linear signal to generate an output signal; and wherein said filter is a variable coefficient filter responsive to said reference clock signal and the output of said analysis circuit.

33. The multi-channel echo canceling apparatus defined in claim 27, wherein said pre-processing circuit comprises:
   a time-varying-coefficient filter responsive to said one non-linear signal and to time-varying control signals to generate said filtered signal.

34. The echo canceling apparatus defined in claim 33, wherein said processing circuit further comprises:
   a frequency divider responsive to a reference clock signal to generate a divided clock signal, said divided clock signal having a frequency less than sampling frequencies associated with the signals to be multiplexed; and
   wherein said control signals for said time-varying-coefficient filter are provided by said divided clock signal and said reference clock signal.

35. The echo canceling apparatus defined in claim 33, wherein said pre-processing circuit further comprises:
   a frequency divider responsive to a reference clock signal to generate a divided clock signal, said divided clock signal having a frequency less than sampling frequencies associated with the signals to be multiplexed,
   an analysis circuit responsive to a predetermined characteristic of said one non-linear signal to generate an output signal; and
   an AND circuit responsive to coincidence of the divided clock signal and the output of said analysis circuit; and
   wherein said filter is a variable coefficient filter responsive to said reference clock signal and the output of said AND circuit.

36. The multi-channel echo canceling apparatus defined in claim 33, wherein said pre-processing circuit further comprises:
   an analysis circuit responsive to a predetermined characteristic of said one non-linear signal to generate an output signal; and
   wherein said filter is a time-varying-coefficient filter controlled by the output of said analysis circuit and a reference clock signal.

37. An echo canceling apparatus for a multi-channel communication including a first and a second station, said apparatus comprising:
   a pre-processing circuit, said preprocessing circuit including:
      a filter connected to receive a selected incoming signal received at said first station from said second station and operative to generate a filtered signal; and
      a multiplexer connected to receive said filtered signal and said selected incoming signal to provide a multiplexed signal;
   a non-linear processing circuit including:
   a first magnitude processing circuit responsive said multiplexed signal to generate a first non-linear output signal;
   a second magnitude processing circuit for each of said incoming signals other than said selected incoming signal, operative to generate a second non-linear output signal;
   a first and a second plurality of adaptive filters each respectively corresponding to an echo source in said communication system,
      said first plurality of adaptive filters being connected to receive said first non-linear output signal as an input thereto, and operative to generate a first plurality of echo replica signals;
      each second non-linear output signal being provided as an input to at least one of said second adaptive filters, said second adaptive filters being operative to generate a second plurality of echo replica signals; and
   a plurality of subtraction circuits operative to subtract selected ones of said first echo replica signals and selected ones of said second echo replica signals from signals being transmitted from said first station from to said second station such that an echo replica signal derived from said first non-linear output signal, and an echo replica signal derived from each second non-linear output signal are subtracted from each transmitted signal.

38. The echo canceling apparatus defined in claim 37, wherein magnitude processing circuits each comprises:
   a polarity detection circuit responsive to the polarity of a selected incoming signal being magnitude processed;
   a coefficient multiplier for multiplying a different one of said incoming signals by a constant;
   a multiplier operative to multiply the output of said polarity detection circuit by the output of said coefficient multiplier; and
   an adder operative to add the output of said multiplier and the selected incoming signal,
   whereby, for one polarity of said selected incoming signal, said magnitude processing circuit adds said different incoming signal multiplied by a constant to said selected incoming signal and outputs the resulting sum, and for the opposite polarity of the selected incoming signal, outputs only said selected incoming signal.

39. The echo canceling apparatus defined in claim 37, wherein said multiplexer comprises a switch having inputs provided by said selected incoming signal and said filtered signal, said switch being operative in response to a control signal to alternately output the inputs thereto.

40. The echo canceling apparatus defined in claim 39, wherein said pre-processing circuit further comprises:
   a frequency divider responsive to a reference clock signal to generate said control signal, said control signal having a frequency less than sampling frequencies associated with the signals to be multiplexed; and
   wherein said filter is a variable coefficient filter responsive to said reference clock signal and said control signal.

41. The echo canceling apparatus defined in claim 39, wherein said pre-processing circuit further comprises:
   a frequency divider responsive to a reference clock signal to generate said control signal, said control signal having a frequency less than sampling frequencies associated with the signals to be multiplexed;
   an analysis circuit responsive to a predetermined characteristic of said selected incoming signal to generate an output signal; and
   an AND circuit responsive to coincidence of the control signal and the output of said analysis circuit; and
   wherein said filter is a variable coefficient filter responsive to said reference clock signal and the output of said AND circuit.

42. The echo canceling apparatus defined in claim 39, wherein said pre-processing circuit further comprises:
   an analysis circuit responsive to a predetermined characteristic of said selected incoming signal to generate an output signal; and
   wherein said filter is a variable coefficient filter responsive to said reference clock signal and the output of said analysis circuit.

43. The multi-channel echo canceling apparatus defined in claim 37, wherein said pre-processing circuit comprises:
 a time-varying-coefficient filter responsive to said selected incoming signal and to time-varying control signals to generate said filtered signal.

44. The echo canceling apparatus defined in claim 43, wherein said processing circuit further comprises:
 a frequency divider responsive to a reference clock signal to generate a divided clock signal, said divided clock signal having a frequency less than sampling frequencies associated with the signals to be multiplexed; and
 wherein said control signals for said time-varying-coefficient filter are provided by said divided clock signal and said reference clock signal.

45. The echo canceling apparatus defined in claim 43, wherein said pre-processing circuit further comprises:
 a frequency divider responsive to a reference clock signal to generate a divided clock signal, said divided clock signal having a frequency less than sampling frequencies associated with the signals to be multiplexed,
 an analysis circuit responsive to a predetermined characteristic of said selected incoming signal to generate an output signal; and
 an AND circuit responsive to coincidence of the divided clock signal and the output of said analysis circuit; and
 wherein said filter is a variable coefficient filter responsive to said reference clock signal and the output of said AND circuit.

46. The multi-channel echo canceling apparatus defined in claim 43, wherein said pre-processing circuit further comprises:
 an analysis circuit responsive to a predetermined characteristic of said selected incoming signal to generate an output signal; and
 wherein said filter is a time-varying-coefficient filter controlled by the output of said analysis circuit and a reference clock signal.

47. An echo canceling apparatus for a multi-channel communication including a first and a second station, said apparatus comprising:
 a non-linear processing circuit connected to process incoming signals received at said first station from said second station, and operative to generate a plurality of non-linear signals;
 a pre-processing circuit connected to receive one of said non-linear signals, said preprocessing circuit including:
  a filter responsive to said one non-linear signal to generate a filtered signal;
  a multiplexer connected to receive said filtered signal and said one non-linear signal and operative to provide a multiplexed signal; and
  a magnitude adjusting circuit that processes said multiplexed signal to produce a magnitude-adjusted signal;
 a first and a second plurality of adaptive filters each respectively corresponding to an echo source in said communication system,
  said first plurality of adaptive filters being connected to receive said magnitude-adjusted signal as inputs thereto, and operative to generate a first plurality of echo replica signals;
  each of said non-linear signals other than said one non-linear signal being provided as an input to at least one of said second plurality of adaptive filters, said second plurality of adaptive filters being operative to generate a second plurality of echo replica signals; and
 a plurality of subtraction circuits operative to subtract selected ones of said echo replica signals from signals being transmitted from said first station from to said second station such that an echo replica signal derived from said one non-linear signal, and an echo replica signal derived from each of said non-linear signals other than said one non-linear signal are subtracted from each transmitted signal.

48. The echo canceling apparatus defined in claim 47, wherein said non-linear recessing circuit comprises a plurality of magnitude processing circuits, each of said magnitude processing circuits including:
 a polarity detection circuit responsive to the polarity of a particular incoming signal;
 a coefficient multiplier for multiplying a different one of said incoming signals by a constant;
 a multiplier operative to multiply the output of said polarity detection circuit by the output of said coefficient multiplier; and
 an adder operative to add the output of said multiplier and said particular incoming signal,
 whereby, for one polarity of said particular incoming signal, said non-linear processing circuit adds said different incoming signal multiplied by a constant to said particular incoming signal and outputs the resulting sum, and for the opposite polarity of the selected incoming signal, outputs only said particular incoming signal.

49. The echo canceling apparatus defined in claim 47, wherein said multiplexer comprises a switch having inputs provided by said one non-linear signal and said filtered signal, said switch being operative in response to a control signal to alternately output the inputs thereto.

50. The echo canceling apparatus defined in claim 49, wherein said pre-processing circuit further comprises:
 a frequency divider responsive to a reference clock signal to generate said control signal, said control signal having a frequency less than sampling frequencies associated with the signals to be multiplexed; and
 wherein said filter is a variable coefficient filter responsive to said reference clock signal and said control signal.

51. The echo canceling apparatus defined in claim 49, wherein said pre-processing circuit further comprises:
 a frequency divider responsive to a reference clock signal to generate said control signal, said control signal having a frequency less than sampling frequencies associated with the signals to be multiplexed;
 an analysis circuit responsive to a predetermined characteristic of said one non-linear signal to generate an output signal; and
 an AND circuit responsive to coincidence of the control signal and the output of said analysis circuit; and
 wherein said filter is a variable coefficient filter responsive to said reference clock signal and the output of said AND circuit.

52. The echo canceling apparatus defined in claim 49, wherein said pre-processing circuit further comprises:
 an analysis circuit responsive to a predetermined characteristic of said one non-linear signal to generate an output; and
 wherein said filter is a variable coefficient filter responsive to said reference clock signal and the output of said analysis circuit.

53. The multi-channel echo canceling apparatus defined in claim 47, wherein said pre-processing circuit comprises:
   a time-varying-coefficient filter responsive to said one non-linear signal and to time-varying control signals to generate said filtered signal.

54. The echo canceling apparatus defined in claim 53, wherein said processing circuit further comprises:
   a frequency divider responsive to a reference clock signal to generate a divided clock signal, said divided clock signal having a frequency less than sampling frequencies associated with the signals to be multiplexed; and
   wherein said control signals for said time-varying-coefficient filter are provided by said divided clock signal and said reference clock signal.

55. The echo canceling apparatus defined in claim 53, wherein said pre-processing circuit further comprises:
   a frequency divider responsive to a reference clock signal to generate a divided clock signal, said divided clock signal having a frequency less than sampling frequencies associated with the signals to be multiplexed,
   an analysis circuit responsive to a predetermined characteristic of said one non-linear signal to generate an output signal; and
   an AND circuit responsive to coincidence of the divided clock signal and the output of said analysis circuit; and
   wherein said filter is a variable coefficient filter responsive to said reference clock signal and the output of said AND circuit.

56. The multi-channel echo canceling apparatus defined in claim 53, wherein said pre-processing circuit further comprises:
   an analysis circuit responsive to a predetermined characteristic of said one non-linear signal to generate an output signal; and
   wherein said filter is a time-varying-coefficient filter controlled by the output of said analysis circuit and a reference clock signal.

57. An echo canceling apparatus for a multi-channel communication including a first and a second station, said apparatus comprising:
   a pre-processing circuit; said preprocessing circuit including:
      a filter connected to receive a selected one of a plurality incoming signal received at said first station from said second station and operative to generate a filtered signal; and
      a multiplexer connected to receive said filtered signal and said selected incoming signal to provide a multiplexed signal; and
      a magnitude adjusting circuit operative to adjust the magnitude of each incoming signal other than said selected incoming signal;
   a non-linear processing circuit including:
      a first magnitude processing circuit responsive to said multiplexed signal to generate a first non-linear signal;
      a second magnitude processing circuit responsive to each magnitude-adjusted incoming signal to generate a second non-linear signal;
   a first and a second plurality of adaptive filters each respectively corresponding to an echo source in said communication system,
      said first plurality of adaptive filters being connected to receive said multiplexed signal as inputs thereto, and operative to generate a first plurality of echo replica signals;
      each of said second non-linear signals being provided as an input to at least one of said second plurality of adaptive filters,
      said second plurality of adaptive filters being operative to generate a second plurality of echo replica signals; and
   a plurality of subtraction circuits operative to subtract selected ones of said first echo replica signals and selected ones of said second echo replica signals from signals being transmitted from said first station to said second station such that an echo replica signal derived from said first non-linear output signal, and an echo replica signal derived from each of said second non-linear output signals are subtracted from each transmitted signal.

58. The echo canceling apparatus defined in claim 57, wherein each of said magnitude processing circuits includes:
   a polarity detection circuit responsive to the polarity of an input signal being processed;
   a coefficient multiplier for multiplying an input signal other than the one being processed by a constant;
   a multiplier operative to multiply the output of said polarity detection circuit by the output of said coefficient multiplier; and
   an adder operative to add the output of said multiplier and the selected incoming signal,
   whereby, for one polarity of said selected input signal being processed, said non-linear processing circuit adds said other incoming signal multiplied by a constant to said input signal being processed, and outputs the resulting sum, and for the opposite polarity of the input signal being processed, outputs only said input signal.

59. The echo canceling apparatus defined in claim 57, wherein said multiplexer comprises a switch having inputs provided by said selected incoming and said filtered signal, said switch being operative in response to a control signal to alternately output the inputs thereto.

60. The echo canceling apparatus defined in claim 57, wherein said pre-processing circuit further comprises:
   a frequency divider responsive to a reference clock signal to generate said control signal, said control signal having a frequency less than sampling frequencies associated with the signals to be multiplexed; and
   wherein said filter is a variable coefficient filter responsive to said reference clock signal and said control signal.

61. The echo canceling apparatus defined in claim 57, wherein said pre-processing circuit further comprises:
   a frequency divider responsive to a reference clock signal to generate said control signal, said control signal having a frequency less than sampling frequencies associated with the signals to be multiplexed;
   an analysis circuit responsive to a predetermined characteristic of said selected incoming signal to generate an output signal; and
   an AND circuit responsive to coincidence of the control signal and the output of said analysis circuit; and
   wherein said filter is a variable coefficient filter responsive to said reference clock signal and the output of said AND circuit.

62. The echo canceling apparatus defined in claim 57, wherein said pre-processing circuit further comprises:
   an analysis circuit responsive to a predetermined characteristic of said selected incoming signal to generate an output signal; and
   wherein said filter is a variable coefficient filter responsive to said reference clock signal and the output of said analysis circuit.

63. The multi-channel echo canceling apparatus defined in claim 57, wherein said pre-processing circuit comprises:

a time-varying-coefficient filter responsive to said selected incoming signal and to time-varying control signals to generate said filtered signal.

64. The echo canceling apparatus defined in claim 63, wherein said processing circuit further comprises:

a frequency divider responsive to a reference clock signal to generate a divided clock signal, said divided clock signal having a frequency less than sampling frequencies associated with the signals to be multiplexed; and wherein said control signals for said time-varying-coefficient filter are provided by said divided clock signal and said reference clock signal.

65. The echo canceling apparatus defined in claim 63, wherein said pre-processing circuit further comprises:

a frequency divider responsive to a reference clock signal to generate a divided clock signal, said divided clock signal having a frequency less than sampling frequencies associated with the signals to be multiplexed, an analysis circuit responsive to a predetermined characteristic of said selected incoming signal to generate an output signal; and an AND circuit responsive to coincidence of the divided clock signal and the output of said analysis circuit; and wherein said filter is a variable coefficient filter responsive to said reference clock signal and the output of said AND circuit.

66. The multi-channel echo canceling apparatus defined in claim 63, wherein said pre-processing circuit further comprises:

an analysis circuit responsive to a predetermined characteristic of said selected incoming signal to generate an output signal; and wherein said filter is a time-varying-coefficient filter controlled by the output of said analysis circuit and a reference clock signal.

* * * * *